(12) United States Patent
Hayashi

(10) Patent No.: US 6,686,234 B1
(45) Date of Patent: Feb. 3, 2004

(54) SEMICONDUCTOR DEVICE AND METHOD FOR FABRICATING THE SAME

(75) Inventor: Manabu Hayashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/631,834

(22) Filed: Aug. 3, 2000

(30) Foreign Application Priority Data

Dec. 24, 1999 (JP) .......................................... 11-366352

(51) Int. Cl.[7] .......................................... H01L 21/8242
(52) U.S. Cl. ........................ 438/239; 438/381; 438/255; 438/398
(58) Field of Search ................................ 438/239, 381, 438/255, 398

(56) References Cited

U.S. PATENT DOCUMENTS

| | | | | |
|---|---|---|---|---|
| 5,149,676 A | * | 9/1992 | Kim et al. | |
| 5,227,322 A | * | 7/1993 | Ko et al. | |
| 5,302,540 A | * | 4/1994 | Ko et al. | |
| 5,358,888 A | * | 10/1994 | Ahn et al. | |
| 5,401,681 A | * | 3/1995 | Dennison | |
| 5,405,801 A | * | 4/1995 | Han et al. | |
| 5,492,848 A | * | 2/1996 | Lur et al. | |
| 5,554,557 A | * | 9/1996 | Koh et al. | |
| 5,872,033 A | * | 2/1999 | Figura | |
| 5,923,989 A | * | 7/1999 | Lin et al. | 438/398 |
| 5,942,447 A | * | 8/1999 | Miyahuni | 438/740 |
| 6,037,220 A | * | 3/2000 | Chien et al. | |
| 6,204,141 B1 | * | 3/2001 | Lou | |

FOREIGN PATENT DOCUMENTS

| | | |
|---|---|---|
| JP | 06-151711 | 5/1994 |
| JP | 11-177031 | 7/1999 |

* cited by examiner

*Primary Examiner*—Long Pham
(74) *Attorney, Agent, or Firm*—Armstrong, Kratz, Quintos, Hanson & Brooks, LLP

(57) ABSTRACT

The method for fabricating a semiconductor device comprises the steps of: forming a silicon film on an insulation film; forming on the silicon film a rugged polycrystalline silicon film having a rugged surface; and etching the rugged polycrystalline silicon film and the silicon film in a region where concavities on the surface of the rugged polycrystalline silicon film are formed under etching conditions which make the deposition relatively strong with respect to the etching to thereby deepen the concavities. Accordingly, the etching back of the rugged polycrystalline silicon film does not decrease a capacitance and, to the contrary, can increase the capacitance. Furthermore, it is not necessary to secure a capacitance that the silicon film for forming the storage electrode is thicker in advance, which makes the fabrication process simple.

13 Claims, 23 Drawing Sheets

SEMICONDUCTOR DEVICE AND METHOD FOR FABRICATING THE SAME

BACKGROUND OF THE INVENTION

The present invention relates to a semiconductor device, specifically to a semiconductor device including a capacitor having the surface of the electrode roughened, and a method for fabricating the semiconductor device.

A DRAM (Dynamic Random Access Memory) is a semiconductor device which can be formed of one transistor and one capacitor. Various studies have been so far made of structures of such semiconductor device which are denser and more integrated, and also methods for fabricating the semiconductor device of such structures.

Recently, as a structure which provides a larger storage capacitance for a cell area unchanged, a structure including the storage electrode formed of polycrystalline silicon film having the rugged surface (rugged polycrystalline silicon film) is proposed, and various studies are made of such semiconductor device.

A structure of the conventional semiconductor device using rugged polycrystalline silicon film will be explained with reference to FIGS. 21A–21C, 22A–22B and 23A–23B.

First, a transfer transistor is formed on a silicon substrate 100 in a device region defined by a device isolation film 102. The transfer transistor comprises a gate electrode 106 formed through a gate insulation film 104 on the silicon substrate 100, and a source/drain diffused layer 108, 110 in the silicon substrate 100 on both sides of the gate electrode 106 (FIG. 21A).

Then, BPSG film is deposited by, e.g., CVD method on the silicon substrate 100 with the transfer transistor formed on to form an inter-layer insulation film 112 of the BPSG film.

Next, a contact hole 114 which is opened onto the source/drain diffused layer 108 of the transfer transistor is formed in the inter-layer insulation film 112 by the usual lithography and etching (FIG. 21B).

Then, a doped amorphous silicon film 116 is deposited on the entire surface by, e.g., CVD method (FIG. 21C).

Then, the doped amorphous silicon film 116 is patterned by the usual lithography and etching to form a storage electrode 118 (FIG. 22A).

Next, a rugged polycrystalline silicon film 120 is deposited on the entire surface by e.g., CVD method (FIG. 22B).

Then, the rugged polycrystalline silicon film 120 is etched back by anisotropic etching using chlorine ($Cl_2$) as an etching gas. The rugged polycrystalline silicon film 120 on the inter-layer insulation film 112 is removed.

At this time the rugged polycrystalline silicon film 120 on the storage electrode 118 is concurrently removed. However, a surface contour of the rugged polycrystalline silicon film 120 is reflected on the surface of the storage electrode 118. The rugged polycrystalline silicon film 120 remains on the side wall of the storage electrode 118.

Thus, the storage electrode 118 has the rugged surface and has the rugged polycrystalline silicon film 120 formed on the side walls thereof (FIG. 23A).

Then, a silicon nitride film is deposited on the entire surface by, e.g., CVD method to form a dielectric film 122 of the silicon nitride film.

Next, a doped amorphous silicon film, for example, is deposited on the entire surface by, e.g., CVD method to form a cell plate electrode 124 of the doped amorphous silicon film.

Thus, a capacitor formed of the storage electrode 118, the dielectric film 122 and the cell plate 124 is formed (FIG. 23B).

Thus, a DRAM including the transfer transistor, and a capacitor having the rugged storage electrode is fabricated.

However, the above-described conventional method for fabricating the semiconductor device often causes decrease of a capacitance to a device structure having high aspect ratio of a space between the storage electrodes 118. That is, when an aspect ratio of the space between the storage electrodes 118 is high, an etching rate at the space between the storage electrodes 118 is lowered due to the micro loading effect. In order to completely remove the rugged polycrystalline silicon film 120 between the storage electrodes 118, more etching time is required. Too much etching time decreases a film thickness of the storage electrodes 118. Consequently, the storage electrodes 118 have decreased surface areas, which leads to the capacitance decrease.

In order to depress the capacitance reduction, it is necessary that a doped amorphous silicon film 116 which is to form the storage electrodes are made thicker in advance. However, it makes time of forming the storage electrodes 118 longer and makes it difficult to condition the etching for forming the storage electrodes 118. Furthermore, it more burdens the system for fabricating the semiconductor device.

SUMMARY OF THE INVENTION

An object of the present invention is to provide a semiconductor device and a method for fabricating the semiconductor device which permits the surface of the storage electrodes rugged without decreasing a capacitance and complicating the fabrication steps.

The present invention is characterized mainly in that, in etching back the polycrystalline silicon film having the rugged surface (hereinafter called rugged polycrystalline silicon film (which is also called as a HSG (Hemispherical Grain))), an etching gas including a halogen based gas and $O_2$ gas and etching conditions which make the deposition relatively strong with respect to the etching are used. The etching back of the rugged polycrystalline silicon film under such conditions is applied to, e.g., a method for forming a storage electrode having the rugged surface, whereby the storage electrode can have a surface area increased without sacrificing a height of the storage electrode.

The principle of the present invention will be explained by means of an example that the present invention is applied to the etching back of the rugged polycrystalline silicon film formed on the storage electrode pattern.

Generally, the etching process of reactive ion etching is a competing reaction between the deposition and the etching. Here, the deposition is caused by adsorption of neutral radicals, and the etching is caused mainly by ions as an etchant. Respective movements of the radicals and the ions will be explained. The radicals, which are electrically neutral, are isotropic in their moving direction. The ions, which are charged, are anisotropic in the vertical direction of a wafer because the ions are attracted by a plasma sheath voltage. Accordingly, when the etching process is considered in a region of a high aspect ratio, the anisotropic ions are easier to enter the space than the radical, so that the micro loading effect of the radicals is occurred prior to that of the ions. When the space has a small width, the micro loading effect that the ions and the radicals cannot easily enter the space, and the etching rate is low is caused. However, as shown in FIGS. 1A and 1B, in terms of incidence amounts of the ions and those of the radicals, space widths for causing the micro loading effect are different from each other. Resultantly, as a space width is decreased, an etching rate once increases in a certain region due to the micro loading effect of the radicals, and then decreases due to the micro loading effect of the ions (FIG. 1C).

The present invention utilizes different space widths for causing the micro loading effect of the ions and the radical so as to control the etching.

In the present invention, conditions using a etching gas including halogen based gas and $O_2$ gas, which make the deposition stronger are used for etching back the rugged polycrystalline silicon film. Here, conditions for making the deposition stronger mean conditions under which the deposition is relatively strong with respect to the etching. In terms of oxygen flow rates, the conditions may be said to be conditions under which an oxygen gas ratio for causing the deposition is high.

In the initial stage of the etching, i.e., in the stage where the rugged polycrystalline silicon film is present on the entire surface of a wafer, the oxygen in the etching gas is used for the etching on the entire surface of the wafer. Accordingly, oxidation of the surface of the rugged polycrystalline silicon is relatively little, and the etching of the rugged polycrystalline silicon film advances. In this step, the etching conditions make the deposition weak.

When the etching advances, and the rugged polycrystalline silicon film between the storage electrodes and the rugged polycrystalline silicon film in a peripheral circuit region is removed, an area ratio of a region of the wafer entire surface where the silicon is present is decreased to about 10–20 percentage. Accordingly, the oxygen in the etching gas becomes excessive, and the silicon surface of the storage electrode is oxidized. Consequently, the etching on the storage electrode surface substantially stops. In this step, the etching conditions make the deposition stronger.

However, the oxidation of the silicon surface depends on oxygen radicals, and the same phenomena as the above-described micro loading effect takes place. In other words, because oxygen radicals cannot easily enter narrow spaces, such as surface concavities of the rugged polycrystalline silicon film, the oxidation in a region where the surface concavities of the rugged polycrystalline silicon are formed is little. On the other hand, halogen ions as an etchant can enter narrow spaces, such as the surface concavities of the rugged polycrystalline silicon film without causing the micro loading effect, and the etching advances in the surface concavities of the rugged polycrystalline silicon film.

Consequently, the surface convexities of the rugged polycrystalline silicon film protected by the oxygen radicals is not etched, and the etching advances in the surface concavities of the rugged polycrystalline silicon film which is not protected by the oxygen radicals. Accordingly, even after the etching-back of the rugged polycrystalline silicon film, a height of the storage electrode does not substantially change. Additionally, a more deeply rugged surface than the as-deposited rugged polycrystalline silicon film can be formed on the surface of the storage electrode.

FIG. 2 is a graph of height changes of the storage electrode with respect to oxygen flow rates at a 100 sccm chlorine gas flow rate as a halogen gas, under a 1.5 mTorr reaction chamber pressure, and at a 1200 W-ECR power and a 100 W-RF power. In the graph, ♦ represents measured height of the storage electrode near the center of a wafer, and ■ represents measured height of the storage electrode near the top surface of the wafer. The sample before the etching includes the doped amorphous silicon film of an initial film thickness of 550 nm, and the rugged polycrystalline silicon film formed on the doped amorphous silicon film.

As shown, it is understood that an oxygen flow rate is set to be above 25 sccm, whereby decrease of the storage electrode height can be much depressed. Considering that a thickness of the rugged polycrystalline silicon film is about 50 nm, the decrease of the storage electrode height can be depressed to be about 60 nm.

However, conditions for making the deposition stronger are determined by interrelationships between oxygen amounts (oxygen flow rates) for the deposition and ion energy (RF powers). In other words, when an RF power is high although an oxygen flow rate is high, the etching is often dominant because incidence energy of the ions is high. Oppositely, when an RF power is low although an oxygen flow rate is low, the deposition is often dominant because incidence energy of the ions is low.

In the typical case where a mixed gas of chlorine and oxygen is used as an etching gas, conditions for making the deposition stronger are conditions belonging to the lower right region with respect to the straight line in FIG. 3A. In the typical case where a mixed gas of HBr and oxygen is used, conditions for making the deposition stronger are those belonging to the lower right region with respect to the straight line in FIG. 3B. However, conditions for making the deposition stronger depend on a kind of a used etching gas and various parameters of apparatuses. It is preferable to adjust and set such conditions suitably for etching environments.

FIG. 4 is a graph of oxygen flow rate dependency of etching rates of the doped amorphous silicon film, and of etching selective ratios of the doped amorphous silicon film with respect to the silicon oxide film.

As shown, even when an oxygen flow rate is set to be above 25 sccm, which is the range the present invention can be applied to, the changes of the etching rate and the selective ratio of the doped amorphous silicon film are sufficiently small. Accordingly, setting an oxygen flow rate in the above-described range does not affect the other etching characteristics.

Etching gases which can be used in the present invention are exemplified unlimitedly by $Cl_2/O_2$ system, $HBr/O_2$ system, $SF_6/Cl_2/O_2$ system, $SF_6/O_2$ system, $SF_6/HBr/O_2$ system, $HBr/Cl_2/O_2$ system and these systems mixed with an inert gas (He, Ne, Ar, Xe, $N_2$ or others).

Accordingly, the above-described object is achieved by a semiconductor device comprising: a capacitor which includes a first electrode having a plurality of substantial cylinders on a top surface thereof; a dielectric film formed on the first electrode; and a second electrode formed on the dielectric film.

The above-described object is also achieved by a semiconductor device comprising: a capacitor which includes a first electrode having a side wall and a top surface thereof rugged, concavities formed on the top surface being deeper than those formed on the side wall; a dielectric film formed on the first electrode; and a second electrode formed on the dielectric film.

The above-described object is also achieved by a method for fabricating a semiconductor device comprising the steps of: forming a silicon film on an insulation film; forming on the silicon film a rugged polycrystalline silicon film having concavities on a surface; and etching the rugged polycrystalline silicon film and the silicon film in a region where the concavities are formed to thereby deepen the concavities.

The above-described object is also achieved by a method for fabricating a semiconductor device comprising the steps of: forming a silicon film on a substrate; forming a rugged polycrystalline silicon film having concavities on a surface; etching the rugged polycrystalline silicon film and the silicon film in a region where the concavities are formed to thereby deepen the concavities to form a surface rugged first electrode of the rugged polycrystalline silicon film and the silicon film; forming a dielectric film on the first electrode; and forming a second electrode on the dielectric film.

DETAILED DESCRIPTION OF THE INVENTION

A First Embodiment

The semiconductor device and the method for fabricating the semiconductor device according to a first embodiment of the present invention will be explained with reference to FIGS. 5, 6A–6C, 7A–7B, 8A–8B, and 9A–9B.

Figure 1A:
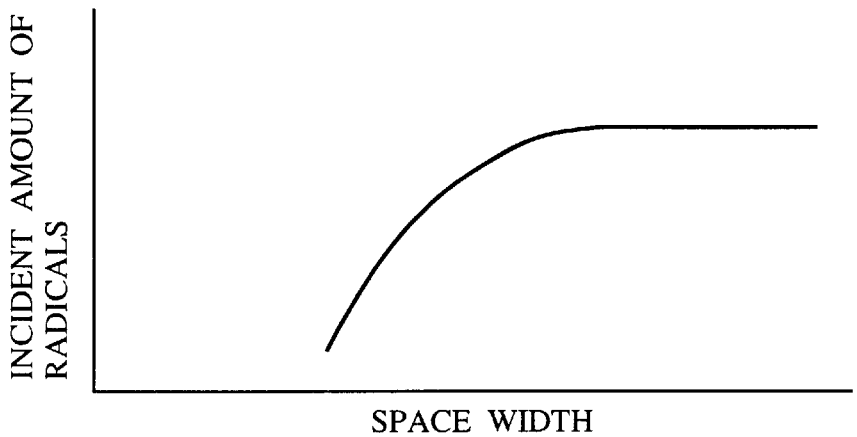
FIGS. 1A–1C are graphs of space width dependency of radical incidence amounts, ion incidence amounts and etching rates.
Figure 1B:
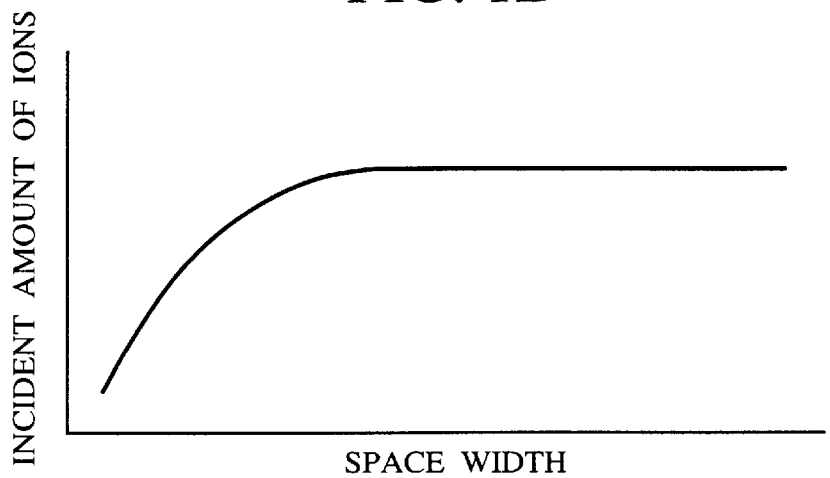
Figure 1C:
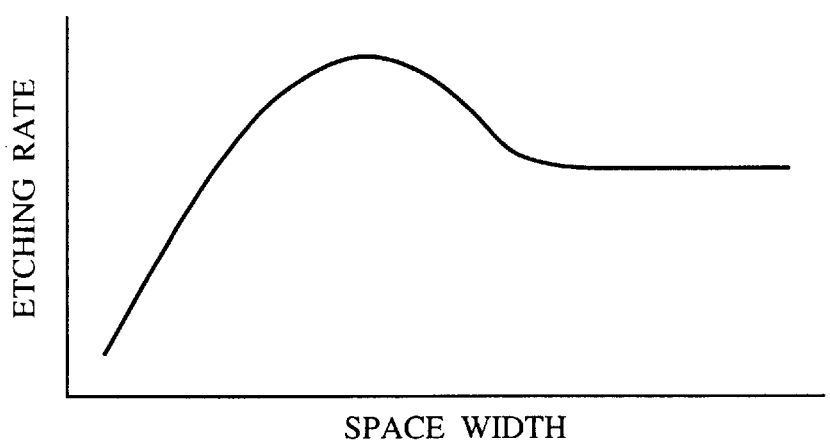
Figure 2:
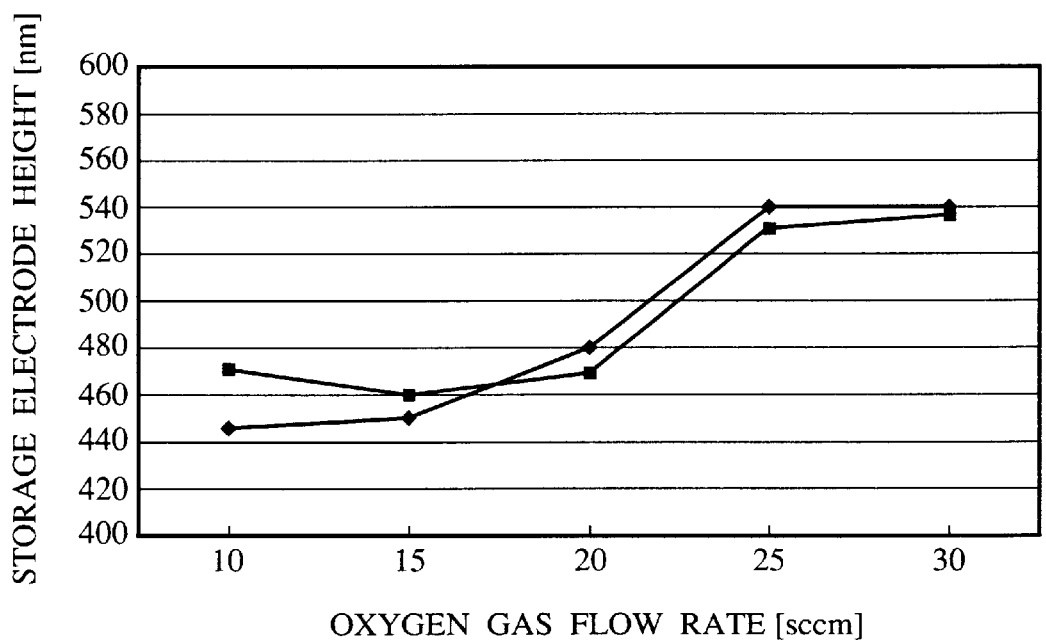
FIG. 2 is a graph of oxygen flow rate dependency of heights of the storage electrode.
Figure 3A:
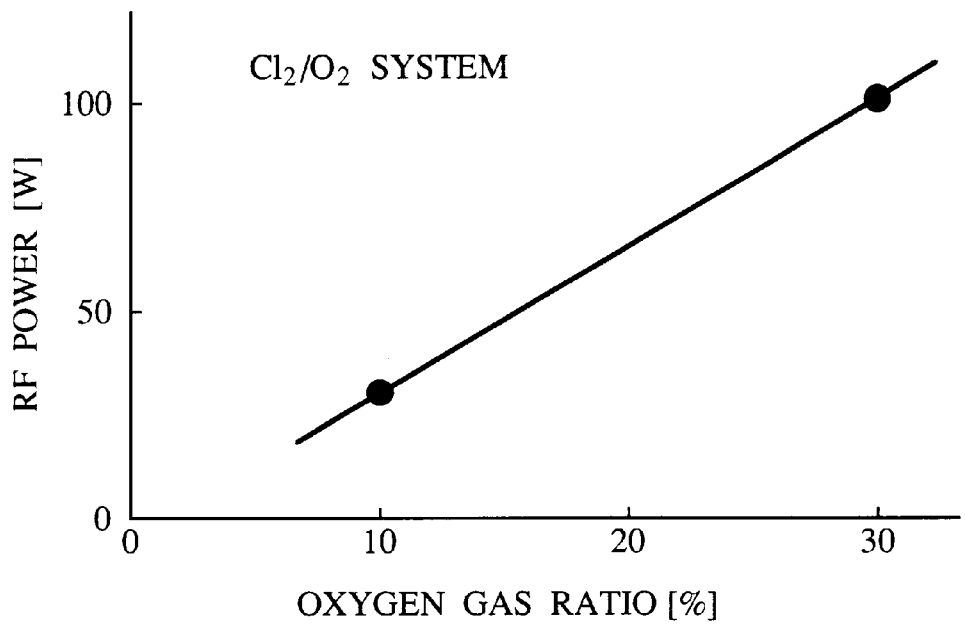
FIGS. 3A and 3B are graphs of etching conditions for $Cl_2/O_2$ system and $HBr/O_2$ system which make the deposition stronger than the etching.
Figure 3B:
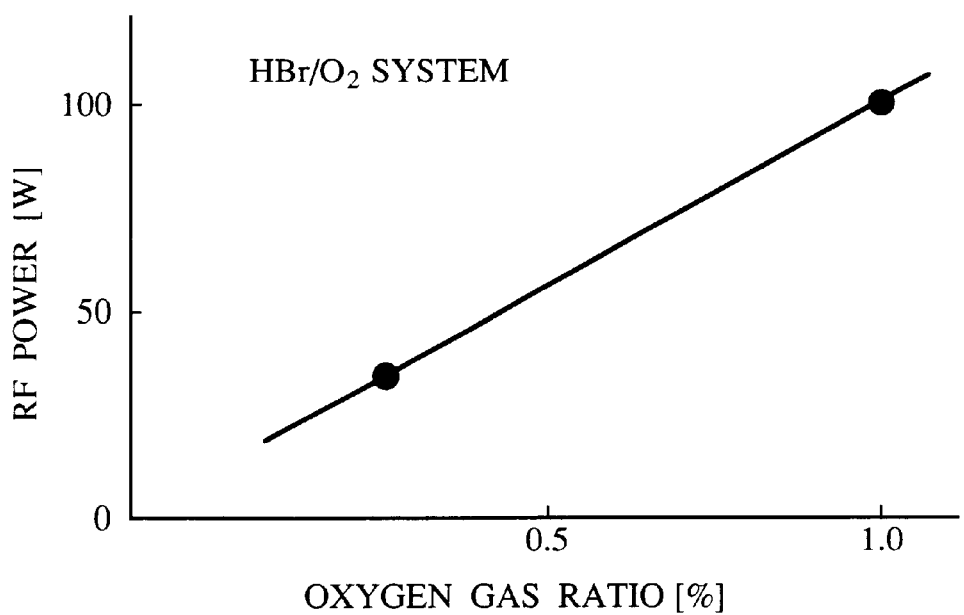
Figure 4:
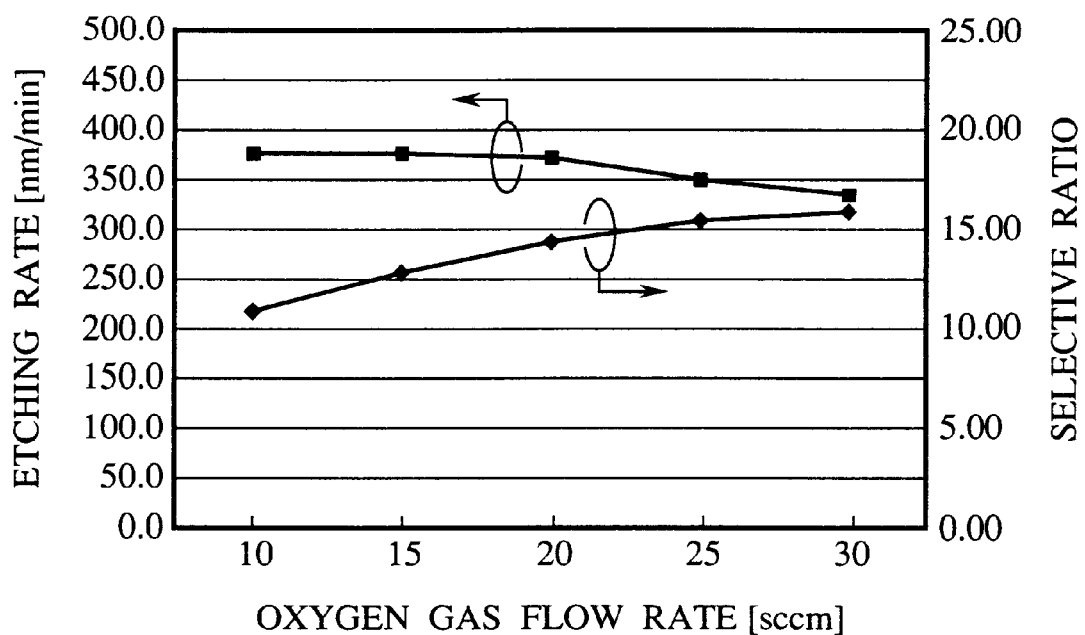
FIG. 4 is a graph of oxygen flow rate dependency of etching rates and selective ratios.
Figure 5:
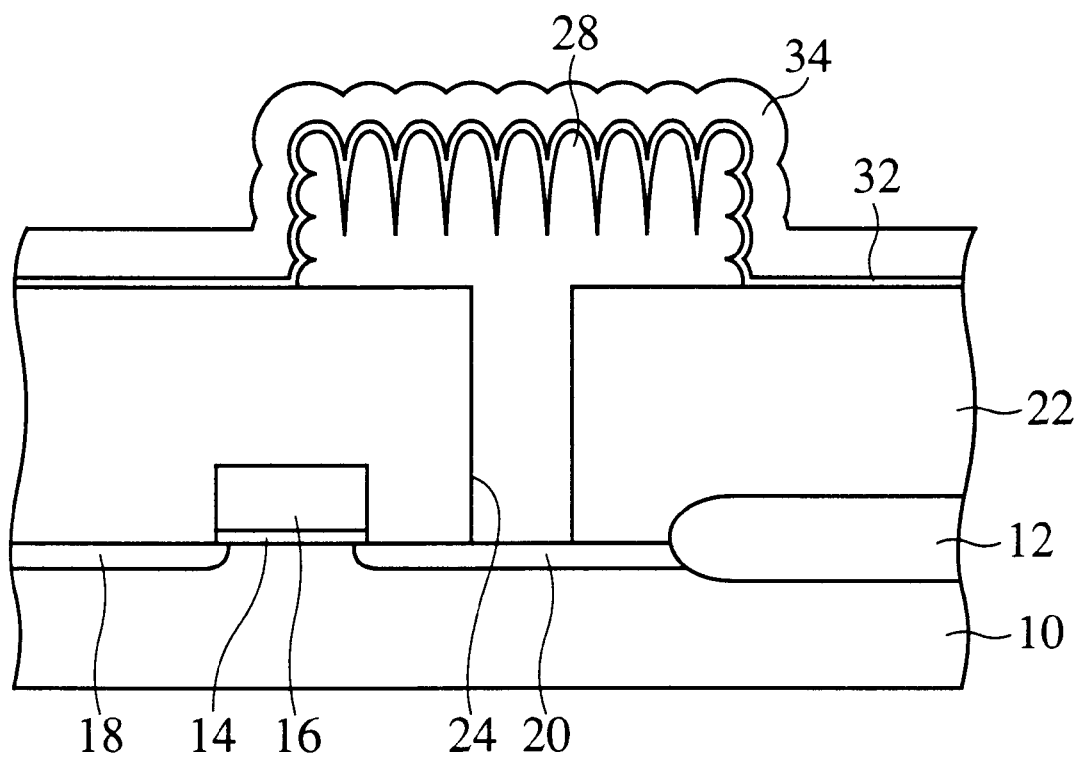
FIG. 5 is a diagrammatic sectional view of the semiconductor device according to a first embodiment of the present invention, which shows a structure thereof.

FIG. 5 is a diagrammatic sectional view of the semiconductor device according to the present embodiment, which shows a structure thereof. FIGS. 6A–6C, 7A–7B, 8A–8B, and 9A–9B are sectional views of the semiconductor device in the steps of the method for fabricating the same, which show the method.

First, the structure of the semiconductor device according to the present embodiment will be explained with reference to FIG. 5.

A transfer transistor is formed on a silicon substrate 10 in a device region defined by a device isolation film 12. The transfer transistor comprises a gate electrode 16 formed on the silicon substrate 10 through a gate insulation film 14, and source/drain diffused layers 18, 20 formed in the silicon substrate 10 on both sides of the gate electrode 16. An inter-layer insulation film 22 of a BPSG film is formed on the silicon substrate 10 with the transfer transistor formed on. A contact hole 24 which is opened onto the source/drain diffused layer 20 is formed in the inter-layer insulation film 22. A storage electrode 28 of a polycrystalline silicon film, connected to the source/drain diffused layer 20 through the contact hole 24 is formed on the inter-layer insulation film 22. A dielectric film 32 of a silicon nitride film is formed on the storage electrode 28. A cell plate electrode 34 of a polycrystalline silicon film is formed on the dielectric film 32.

The semiconductor device according to the present embodiment is characterized in that the top surface and the side walls of the storage electrode 28 have ruggedness, and the concavities on the top surface of the storage electrode 28 are deeper than those on the side wall of the storage electrode 28. The concavities have depth of above about, e.g., 100 nm.

The semiconductor device according to the present embodiment will be detailed in accordance with the fabrication steps.

Figure 6A:
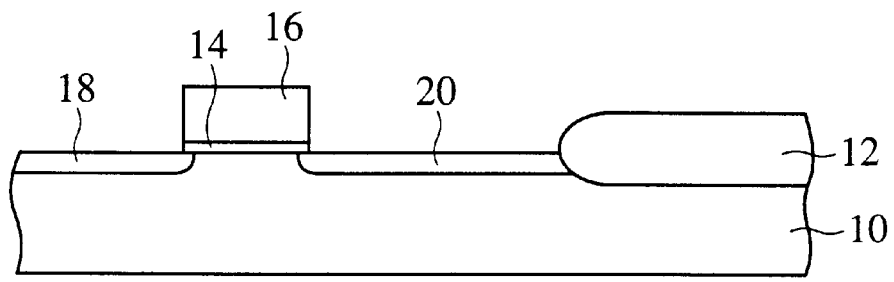
FIGS. 6A–6C, 7A–7B, 8A–8B, and 9A–9B are sectional views of the semiconductor device according to the first embodiment of the present invention in the steps of the method for fabricating the same, which explain the method.

A transfer transistor comprising a gate electrode 16 formed on a silicon substrate 10 through a gate insulation film 14, and source/drain diffused layers 18, 20 formed on the silicon substrate 10 on both sides of the gate electrode 16 is formed in a device region defined by a device isolation film 12 (FIG. 6A).

Figure 6B:
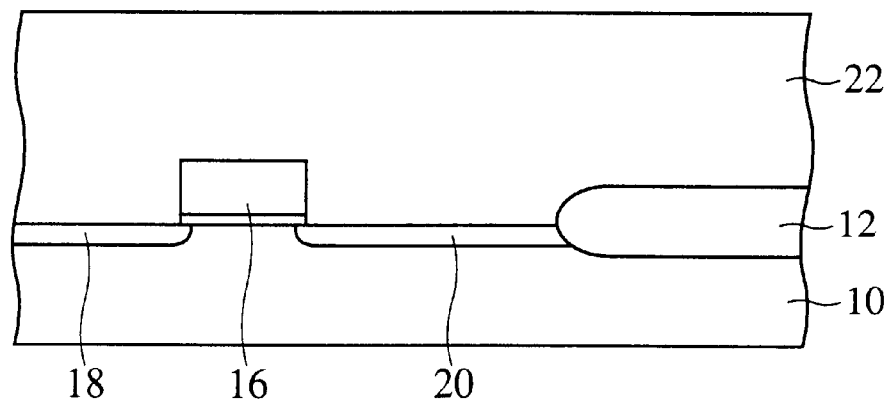

Then, a 1200 nm-thick BPSG (Boro-Phospho-Silicate Glass) film is deposited on the entire surface by, e.g., CVD (Chemical Vapor Deposition) method. Thus the inter-layer insulation film 22 of the BPSG film is formed (FIG. 6B).

Figure 6C:
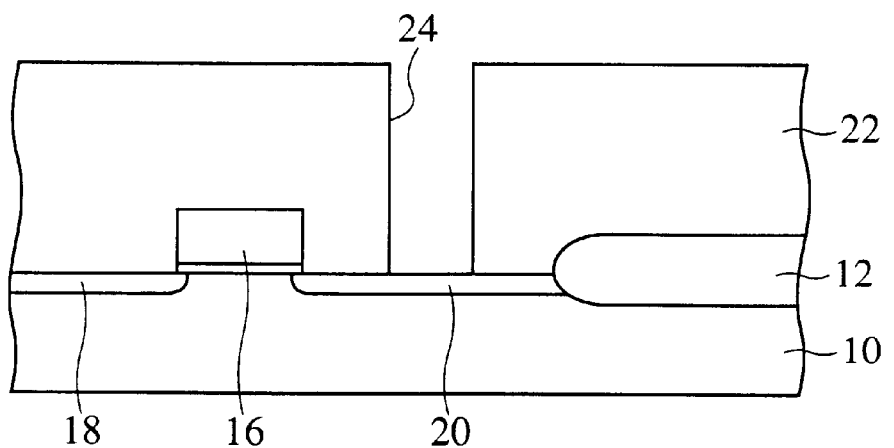

Then, the contact hole 24 is opened in the inter-layer insulation film 22 onto the source/drain diffused layer 20 (FIG. 6C).

Figure 7A:
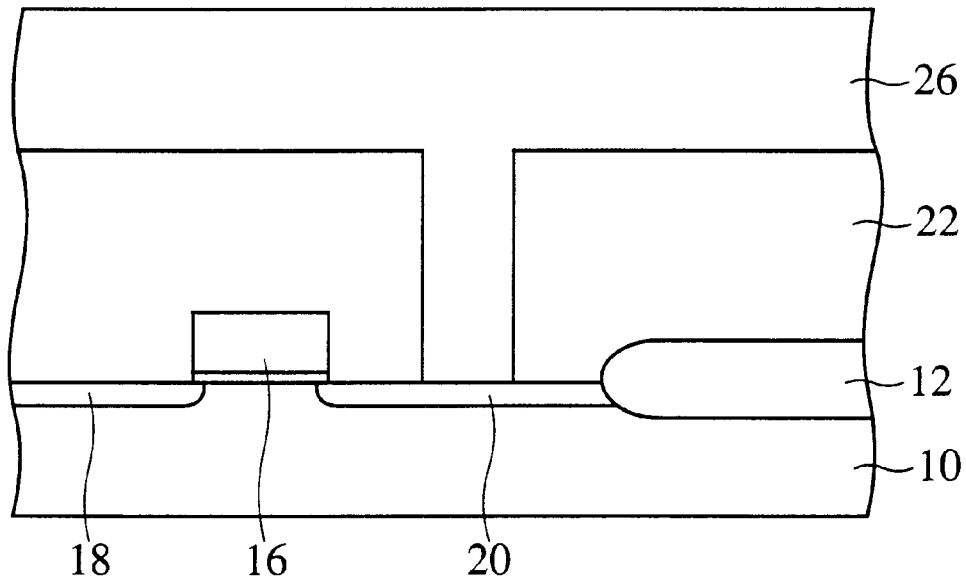

Next, a 550 nm-thick doped amorphous silicon film 26 is deposited on the entire surface by, e.g., CVD method (FIG. 7A).

Figure 7B:
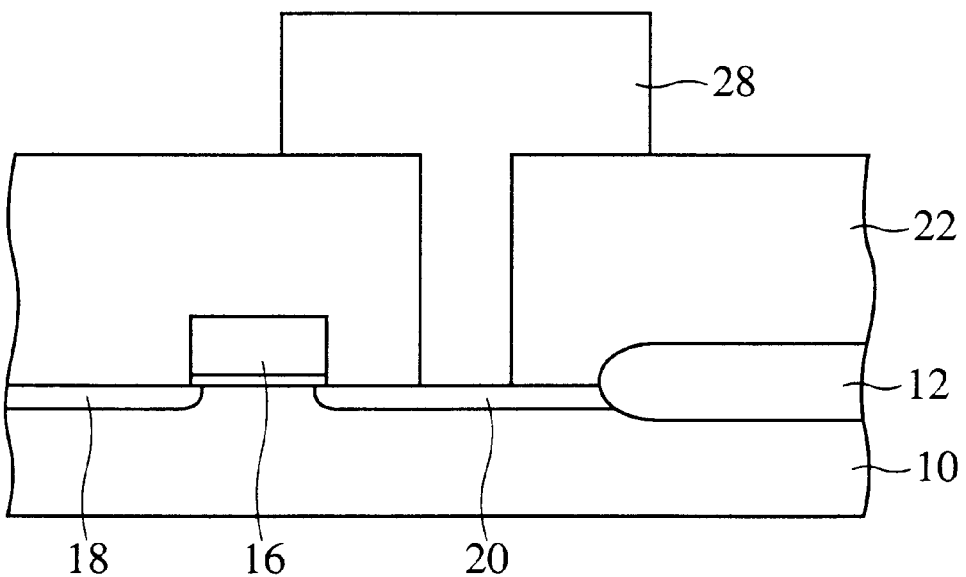

Next, the doped amorphous silicon film 26 is patterned by the usual lithography and etching to form storage electrodes 28 each having the top surface of, e.g., a 400 nm×900 nm size at, e.g., a 200 nm-space (FIG. 7B).

Figure 8A:
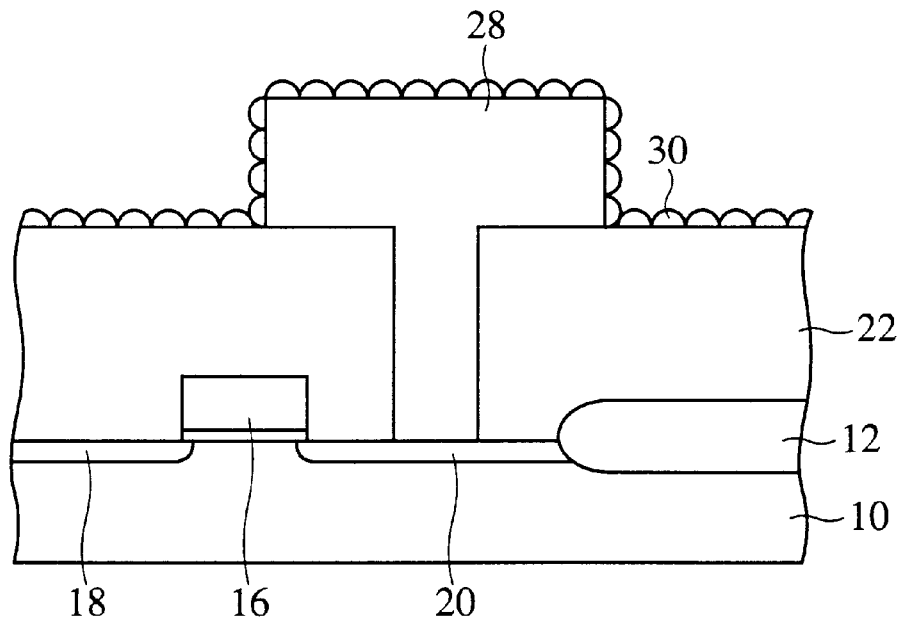

Next, a rugged polycrystalline silicon film 30 is deposited on the entire surface by, e.g., CVD method. The rugged polycrystalline silicon film 30 is deposited, e.g., at 140 sccm $SiH_4$ flow rate, under a 0.175 Torr chamber pressure, at a 575° C. film forming temperature and in a 530 second film forming time. The rugged polycrystalline silicon film 30 having ruggedness of about 50 nm-depth on the surface is formed (FIG. 8A).

Then, the rugged polycrystalline silicon film 30 is anisotropically etched (etched back) under conditions for selective etching the silicon with respect to the BPSG of the inter-layer insulation film 22. The rugged polycrystalline silicon film 30 is etched back, e.g., at a 100 sccm chlorine gas flow rate and a 25 sccm oxygen flow rate, under a 1.5 mTorr reaction chamber pressure, and at a 1200 W ECR power and a 100 W RF power to remove the rugged polycrystalline silicon film 30 on the inter-layer insulation film 22. The above-stated conditions make the deposition relatively weak with respect to the etching while the rugged polycrystalline silicon film 30 is present on the inter-layer insulation film 22.

Figure 8B:
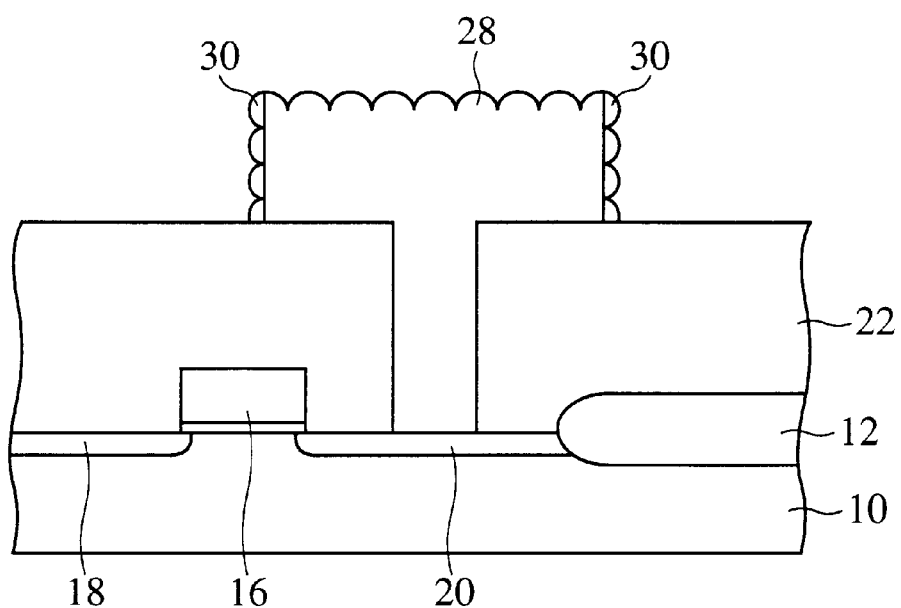

At this time, the rugged polycrystalline silicon film 30 on the top surface of the storage electrode 28 is simultaneously removed, but a surface contour of the rugged polycrystalline silicon film 30 is reflected on the top surface of the storage electrode 28. The rugged polycrystalline silicon film 30 is left as it is, on the side wall of the storage electrode 28 (FIG. 8B).

Figure 9A:
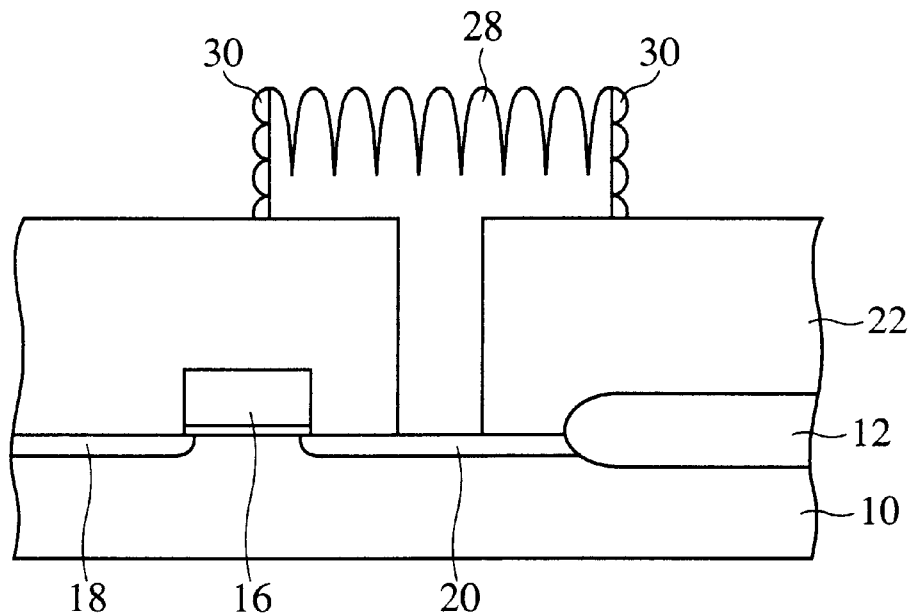

When the etching is further set on after the rugged polycrystalline silicon film 30 has been removed in the regions between the storage electrodes 28 and in a peripheral circuit region, the etching under the above-stated conditions make the deposition relatively strong with respect to the etching. As described above, on the top surface of the storage electrode 28, only a region where the concavities are formed are selectively etched by the micro loading effect. Thus, the concavities in the top surface of the storage electrode can be deepened without decreasing a height of the storage electrode 28 (FIG. 9A).

The etching for deepening the surface concavities in the top surface of the storage electrode 28 does not substantially decrease a height of the convexities. Accordingly, the surface concavities of even about 100 nm-depth, which are deeper than the surface concavities of the as-deposited rugged polycrystalline silicon film 30 of about 50-nm-depth, can be easily formed. In other words, even in a case that due to a small space between the storage electrodes 28, the rugged polycrystalline silicon film 30 between the storage electrodes 28 cannot be easily removed by the micro loading effect, increase of the etching time does not sacrifice a height of the storage electrode 28. To the contrary, very advantageously the surface concavities are deepened to thereby increase a storage capacitance.

The concavities become deeper as an etching amount is larger, which contributes to storage capacitance increase. However, when an etching amount is excessive, the rugged polycrystalline silicon film formed on the upper portion of the side wall of the storage electrode tends to easily peel off. It is preferable that a depth of the concavities is about 100–150 nm.

Thus, the storage electrode 28 having the rugged polycrystalline silicon film 30 formed on the side wall and having the top surface rugged is formed. In this specification, for the convenience of the explanation, the structure formed by patterning the doped amorphous silicon film 26 is called the storage electrode 28, but the structure formed of the rugged polycrystalline silicon film 30 and the storage electrode 28 substantively function as the storage electrode. In this specification the rugged polycrystalline silicon film 30 and the storage electrode 28 are collectively called also the storage electrode 28.

Then, a silicon nitride film is deposited on the entire surface by, e.g., CVD method to form a dielectric film 32 of the silicon nitride film.

Next, a doped amorphous silicon film, for example, is deposited on the entire surface by, e.g., CVD method to form a cell plate electrode 34 of the doped amorphous silicon film.

Figure 9B:
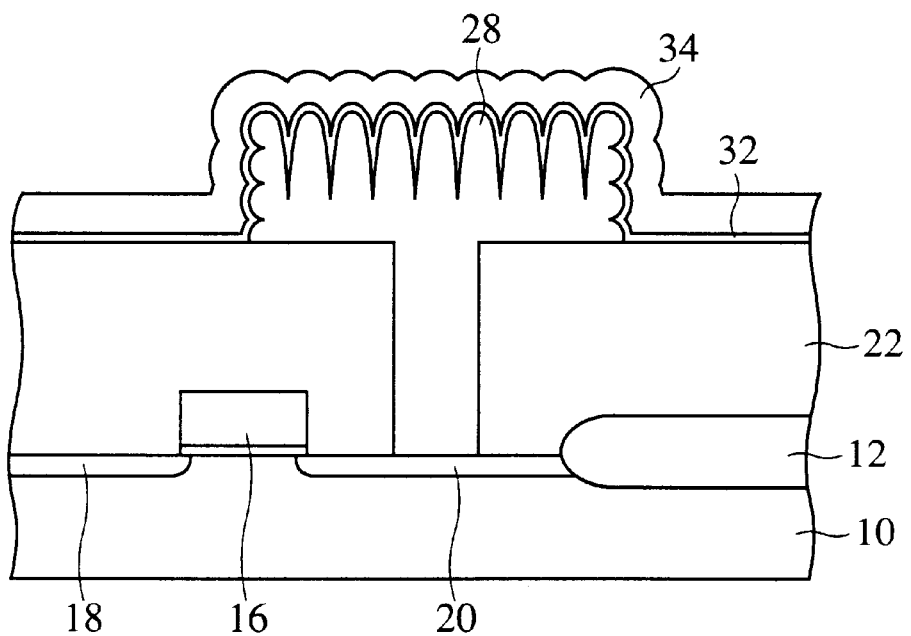

Thus, a capacitor formed of the storage electrode 28, the dielectric film 32 and the cell plate electrode 34 is formed, and a DRAM including one transistor and one capacitor is fabricated (FIG. 9B).

As described above, according to the present embodiment, the rugged polycrystalline silicon film is etched back with an etching gas including halogen based gas and $O_2$ gas under conditions which the deposition is stronger. As a result, the surface concavities on the top surface of the storage electrode can be deepened without decreasing a height of the storage electrode. Accordingly, the etching back of the rugged polycrystalline silicon film 30 does not result in capacitance decrease, but, to the contrary, results in capacitance increase. It is not necessary that the doped amorphous silicon film is formed thick in advance so as to retain a capacitance, which can simplify the fabrication process.

In the present embodiment, conditions which allow the etching for removing the rugged polycrystalline silicon film 30 between the storage electrodes 28 and in the peripheral circuit region and the over-etching for deepening the surface concavities on the top surface of the storage electrode 28 to be achieved by using a certain process parameter are applied to the etching back of the rugged polycrystalline silicon film 30. It is not essential to perform both etchings in one step. For example, conditions which make the deposition relatively weak with respect to the etching are positively used in the step of etching the rugged polycrystalline silicon film 30 between the storage electrodes 28 and in the peripheral circuit region, and conditions which make the deposition relatively strong with respect to the etching are used in the step of etching for deepening the surface concavities in the top surface of the storage electrode 28. Thus, the etchings may be performed in the two steps. In the former etching step, an etching gas which does not contain oxygen (containing, e.g., $Cl_2$ alone) may be used.

A Second Embodiment

The method for fabricating the semiconductor device according to a second embodiment of the present invention will be explained with reference to FIGS. 10A–10B and 11A–11B. The same members of the present embodiment as those of the semiconductor device according to the first embodiment and the method for fabricating the same shown in FIGS. 5 to 9 are represented by the same reference numbers not to repeat or to simplify their explanation.

FIGS. 10A–10B and 11A–11B are sectional views of the semiconductor device according to the present embodiment in the steps of the method for fabricating the same, which show the method.

The method for fabricating the semiconductor device according to the present embodiment are the same as the method for fabricating the semiconductor device according to the first embodiment except selectively growing on a doped amorphous silicon film a rugged polycrystalline silicon film to be storage electrodes.

Then, the method for fabricating the semiconductor device according to the present embodiment will be explained.

Figure 10A:
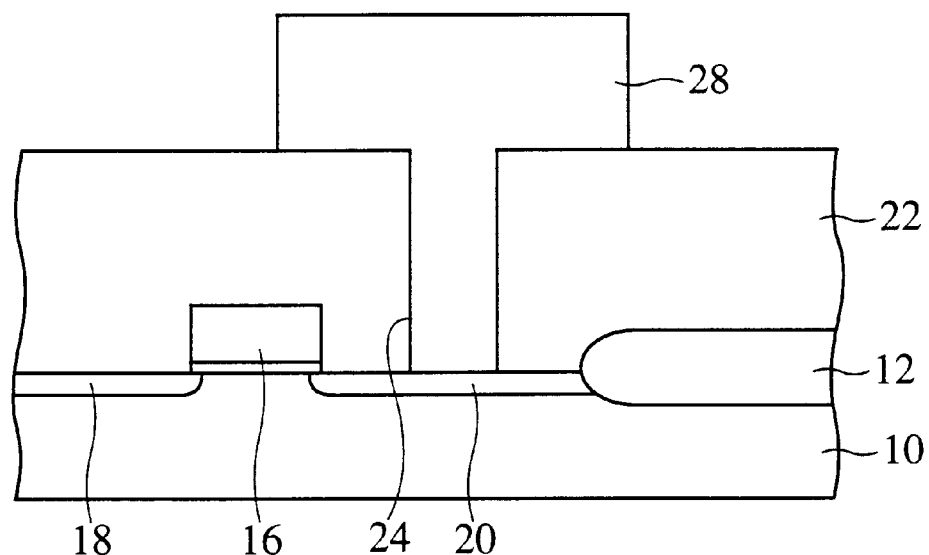
FIGS. 10A–10B and 11A–11B are sectional views of the semiconductor device according to a second embodiment in the steps of the method for fabricating the same, which explain the method.

In the same way as the method for fabricating the semiconductor device according to the first embodiment shown in FIG. 6A to FIG. 7B, a transfer transistor, an inter-layer insulation film 22 and a storage electrode 28 are formed on a silicon substrate 10 (FIG. 10A).

Figure 10B:
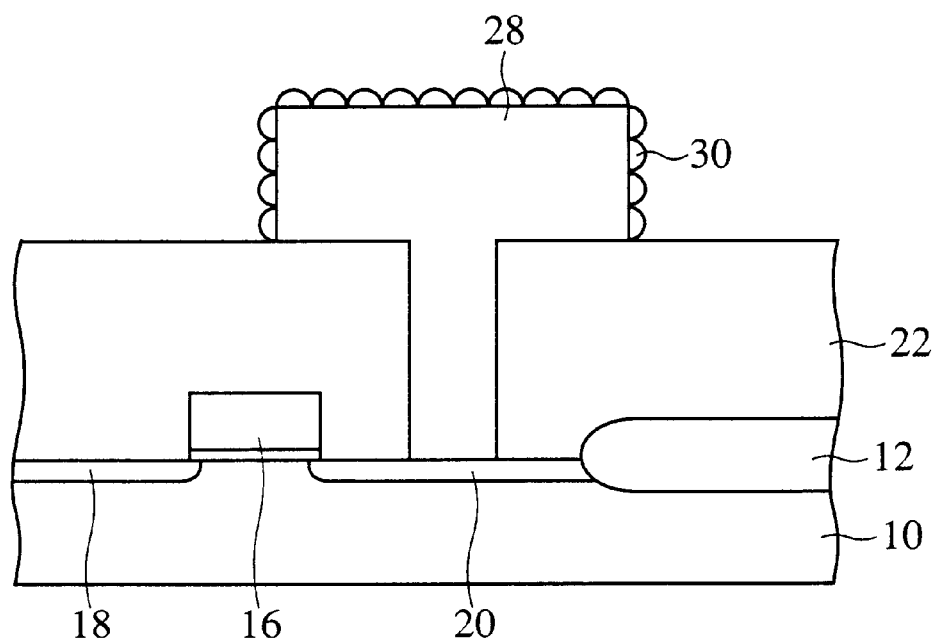

Next, the rugged polycrystalline silicon film 30 is selectively deposited on the surface of the storage electrode 28 of the doped amorphous silicon film (FIG. 10B). The rugged polycrystalline silicon film 30 is selectively deposited only on the top surface and the side wall of the storage electrode 28 by adhering seeds of silicon atoms to the storage electrode 28, e.g., at a 15 sccm $SiH_4$ flow rate, under a $5 \times 10^{-5}$ Torr chamber pressure, at a 700° C. film forming temperature and for a 100 second film forming time, and then performing annealing at a 200 sccm flow rate of Ar gas containing $PH_3$ by 5%, under a 1 Torr pressure, at 700° C. and for 60 minutes.

Figure 11A:
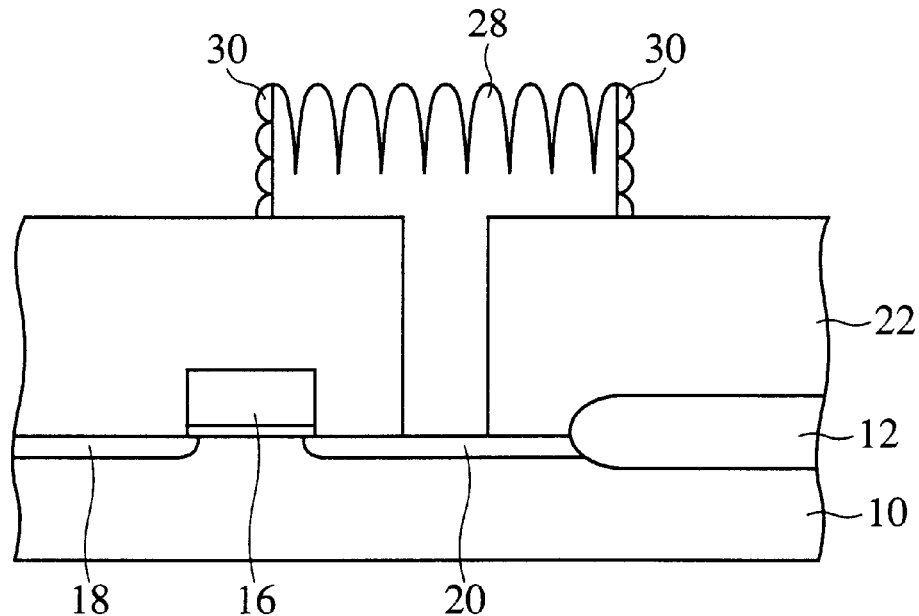

Then, the rugged polycrystalline silicon film 30 is anisotropically etched (etched back) under conditions which allow the silicon to be selectively etched with respect to the BPSG of the inter-layer insulation film 22. In this etching, the rugged polycrystalline silicon film 30 is etched back with an etching gas including a halogen based gas and $O_2$ gas under conditions which make the deposition stronger, e.g., at a 100 sccm chlorine gas flow rate, at a 25 sccm oxygen gas flow rate, a 1.5 mTorr reaction chamber pressure, a 1200 W ECR power, and a 100 W RF power, whereby the surface concavities on the top surface of the storage electrode 28 can be deepened without reducing a height of the storage electrode 28 (FIG. 11A).

The surface concavities on the top surface of the storage electrode 28 can be selectively deepened without reducing a height of the convexities by making an etching time longer. Accordingly, the surface concavity of above about 100 nm depth, which are deeper than the surface concavities of the as-deposited rugged polycrystalline silicon film 30 of about 50-nm depth, can be easily formed.

In selectively forming the rugged polycrystalline silicon film 30, the step of etching back the rugged polycrystalline silicon film 30 between the storage electrodes 28 and in the peripheral circuit region is not necessary. However, the etching back can deepen the surface concavities of the storage electrode 28 without decreasing a height of the storage electrode 28, with a result that a larger capacitance can be provided.

Figure 11B:
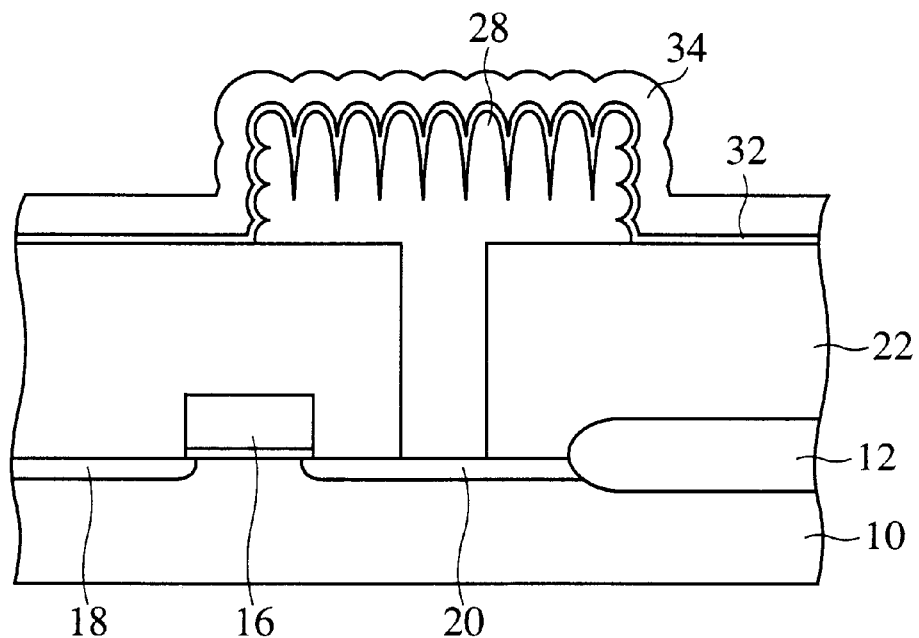

Then, in the same way as the method for fabricating the semiconductor device according to the first embodiment shown in FIG. 9B, a capacitor is formed, and a DRAM including one transistor and one capacitor can be fabricated (FIG. 11B).

According to the present embodiment, even in selectively forming the rugged polycrystalline silicon film on the storage electrode, the surface concavities on the top surface of the storage electrode can be deepened without decreasing a height of the storage electrode.

A Third Embodiment

The semiconductor device and the method for fabricating the semiconductor device according to a third embodiment of the present invention will be explained with reference to FIGS. 12, 13A–13B, 14A–14B and 15. The same members of the present embodiment as those of the semiconductor device and the method for fabricating the semiconductor device according to the first and the second embodiments shown in FIG. 5 to FIG. 11 are represented by the same reference numbers not to repeat or to simplify their explanation.

Figure 12:
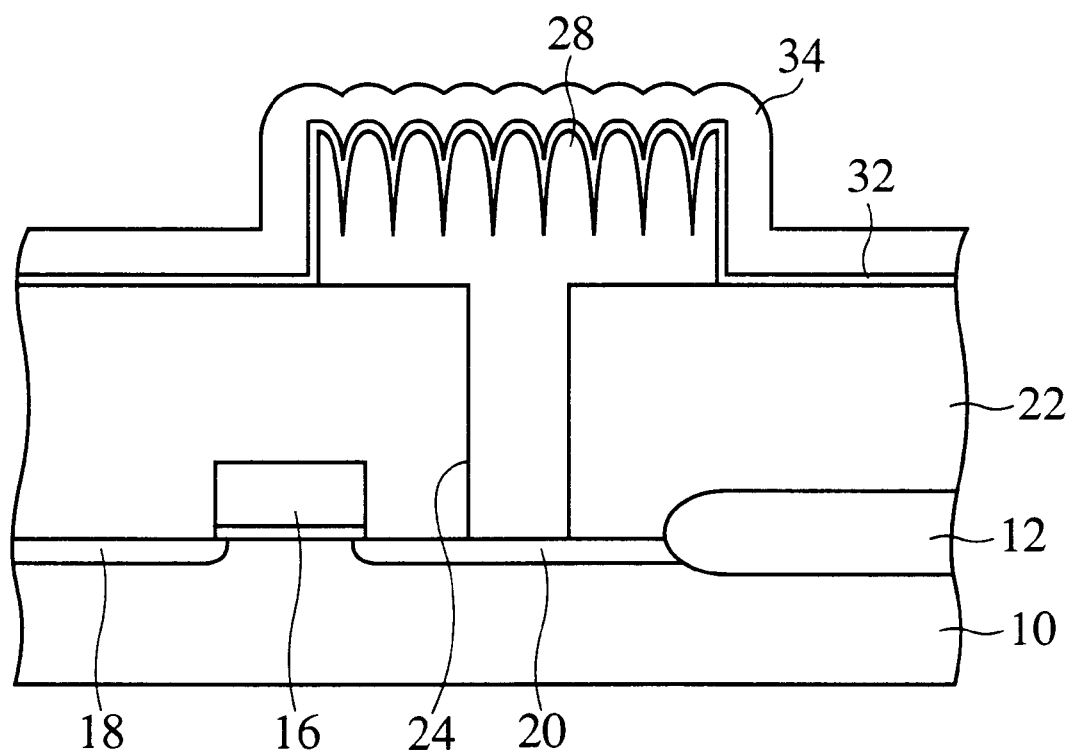
FIG. 12 is a diagrammatic sectional view of the semiconductor device according to a third embodiment of the present invention.

FIG. 12 is a diagrammatic sectional view of the semiconductor device according to the present embodiment, which shows a structure thereof. FIGS. 13, 14A–14B, and 15 are sectional views of the semiconductor device in the steps of the method for fabricating the same, which show the method.

The semiconductor device according to the present embodiment is characterized in that, as shown in FIG. 12, the top surface alone of the storage electrode has ruggedness. The top surface of the storage electrodes 28 have rugged surface of above about 100 nm-depth concavities, which are deeper than the 50 nm-depth concavities of the typical as-deposited rugged polycrystalline silicon film.

According to the present invention, the surface concavities on the top surface of the storage electrode 28 can be sufficiently deeper than the surface concavities provided by the as-deposited rugged polycrystalline silicon film 30. Accordingly, without forming the rugged polycrystalline silicon film 30 on the side walls of the storage electrode 28, a sufficient capacitance can be often provided. Because the rugged polycrystalline silicon film formed on the side walls of the storage electrode 28 tends to peel off, it will be often preferable depending on processes that the rugged polycrystalline silicon film 30 is not formed on the side walls of the storage electrode 28. In such cases, the semiconductor device according to the present embodiment is effective.

Next, the method for fabricating the semiconductor device according to the present embodiment will be explained with reference to FIGS. 13A–13B, 14A–14B, and 15.

Figure 13A:
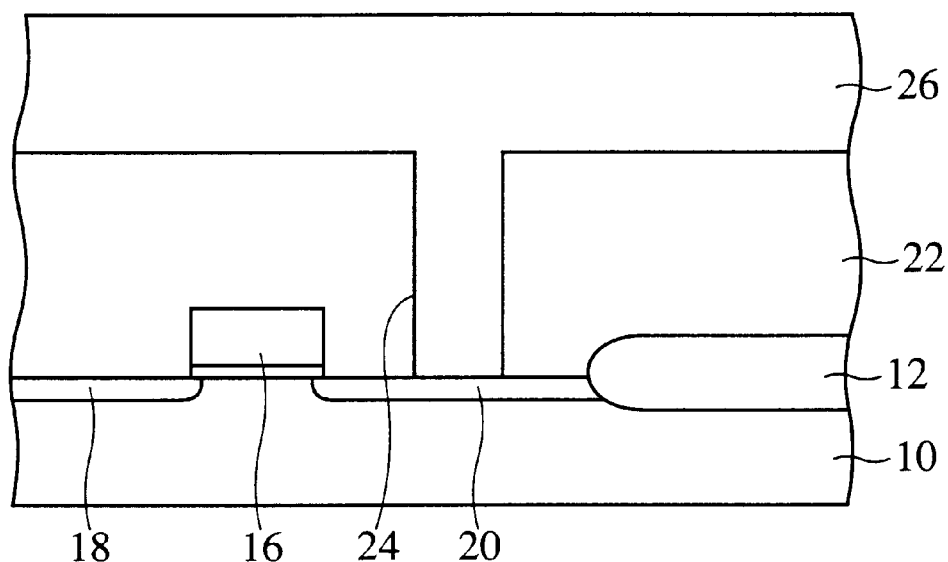
FIGS. 13A–13B, 14A–14B and 15 are sectional views of the semiconductor device according to the third embodiment in the steps of the method for fabricating the same, which explain the method.

First, in the same way as the method for fabricating the semiconductor device according to the first embodiment shown in FIGS. 6A to 7A, a transfer transistor, an inter-layer insulation film 22 with a contact hole 24 formed in, which arrives at a source/drain diffused layer 20, and a doped amorphous silicon film 26 are formed on a silicon substrate 10 (FIG. 13A).

Figure 13B:
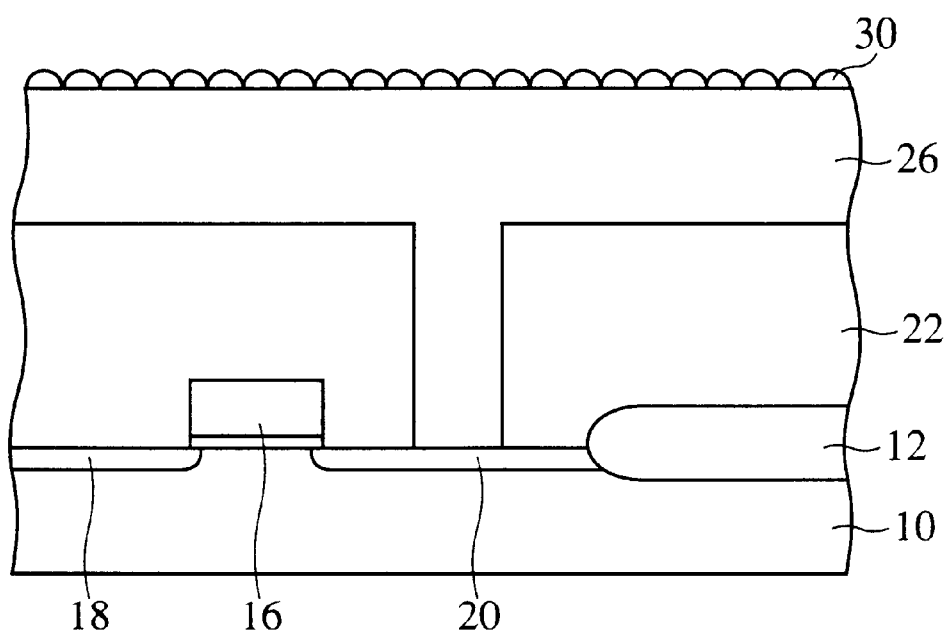

Then, a rugged polycrystalline silicon film 30 is deposited on the entire surface by, e.g., CVD method. The rugged polycrystalline silicon film 30 is deposited, for example, at a 140 sccm $SiH_4$ flow rate, a 0.175 Torr chamber pressure, a 575° C. film forming temperature and for a film forming time of 530 seconds. Thus, the rugged polycrystalline silicon film 30 having about 50 nm-depth concavities is formed (FIG. 13B).

Figure 14A:
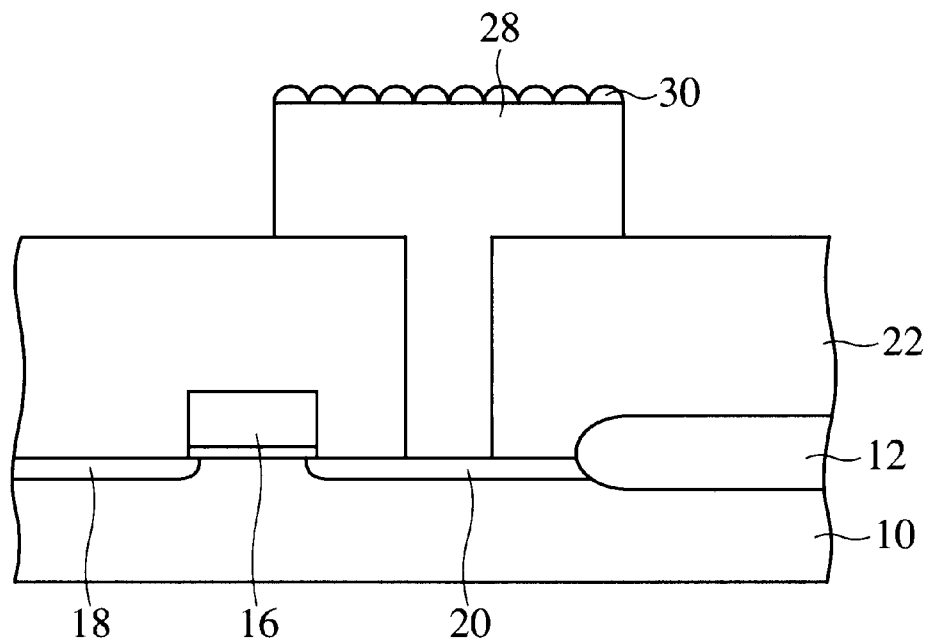

Next, the rugged polycrystalline silicon film 30 and the doped amorphous silicon film 26 are patterned by the usual lithography and etching to form a storage electrode 28 of the doped amorphous silicon film 26 with the rugged polycrystalline silicon film 30 formed on the top surface (FIG. 14A).

Figure 14B:
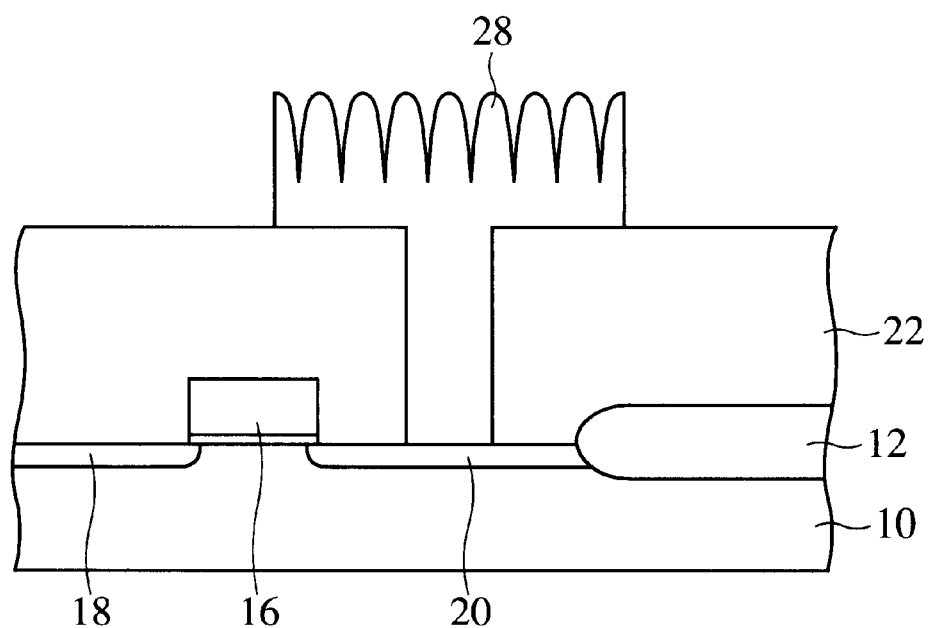

Then, the rugged polycrystalline silicon film 30 is anisotropically etched (etched back) under conditions which allow the silicon to be selectively etched with respect to the BPSG of the inter-layer insulation film 22. In this etching, the rugged polycrystalline silicon film 30 is etched back with an etching gas including a halogen based gas and $O_2$ gas under conditions which make the deposition stronger, e.g., at a 100 sccm chlorine gas flow rate and a 25 sccm oxygen gas flow rate, a 1.5 mTorr reaction chamber pressure, a 1200 W ECR power and a 100 W RF power, whereby the surface concavities in the top surface of the storage electrode 28 can be deepened without reducing a height of the storage electrode 28 (FIG. 14B).

The concavities in the top surface of the storage electrode 28 can be selectively deepened without decreasing a height of the convexities by making the etching time longer. Accordingly, the surface concavities of above about 100 nm depth, which are deeper than the surface concavities of the as-deposited rugged polycrystalline silicon film 30, can be easily formed.

Figure 15:
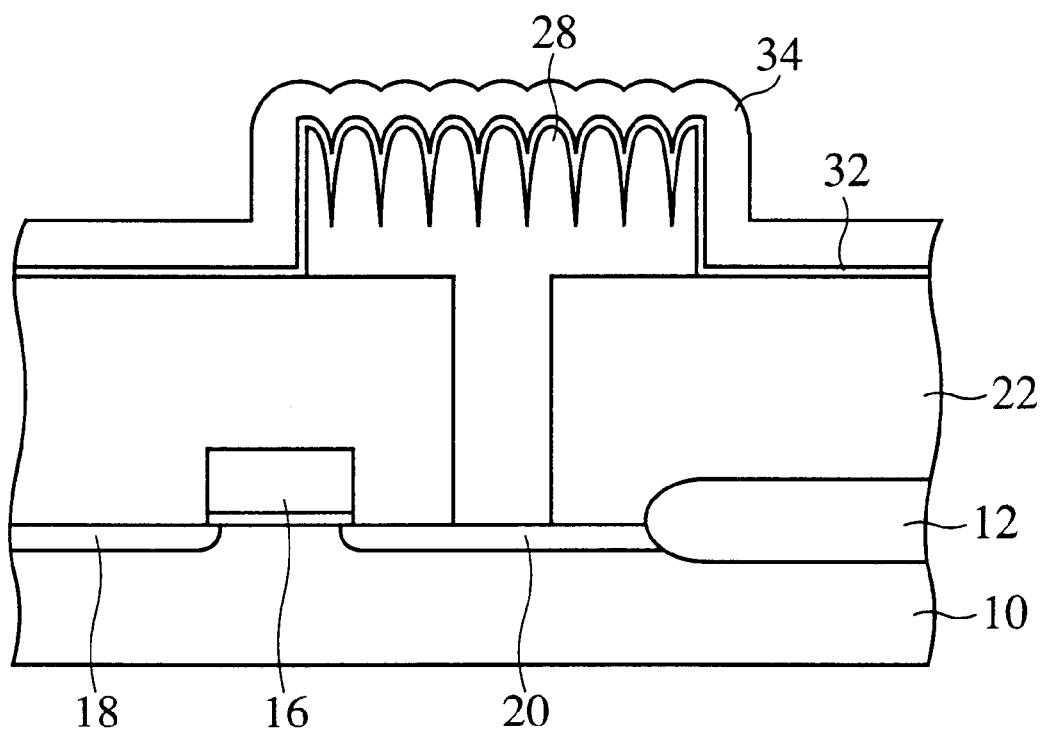

Next, in the same way as the method for fabricating the semiconductor device according to the first embodiment, capacitor is formed, and a DRAM including one transistor and one capacitor is fabricated (FIG. 15).

As described above, according to the present embodiment, even in forming the rugged polycrystalline silicon film only on the top surface of the storage electrode, the surface concavities in the top surface of the storage electrode can be deepened without decreasing a height of the storage electrode.

A Fourth Embodiment

The semiconductor device and the method for fabricating the semiconductor device according to a fourth embodiment of the present invention will be explained with reference to FIGS. 16, 17A–17C, 18A–18B, 19A–19B, and 20A–20B. The same members of the present embodiment as those of the semiconductor device and the method for fabricating the same according to the first to the third embodiments shown in FIGS. 5 to 15 are represented by the same reference numbers not to repeat or to simplify their explanation.

Figure 16:
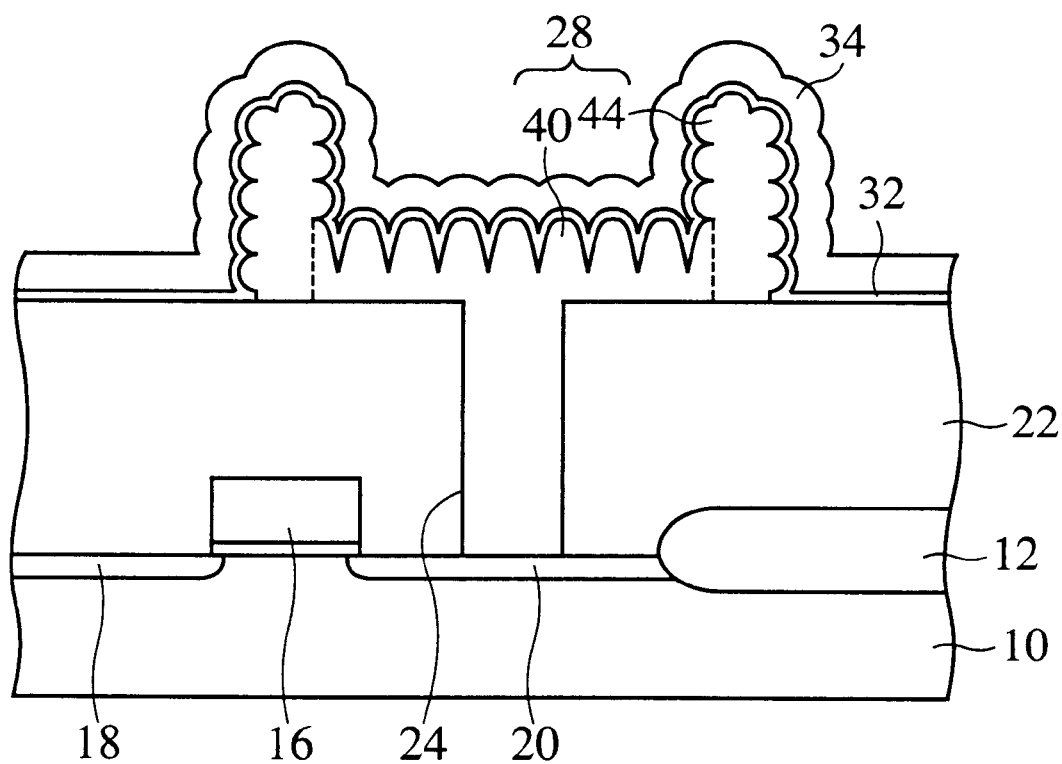
FIG. 16 is a diagrammatic sectional view of the semiconductor device according to a fourth embodiment of the present invention, which shows a structure thereof.

FIG. 16 is a diagrammatic sectional view of the semiconductor device according to the present embodiment, which shows a structure thereof. FIGS. 17A–17C, 18A–18B, 19A–19B, and 20A–20B are sectional views of the semiconductor device according to the present embodiment in the steps of the method for fabricating the same, which explain the method.

As shown in FIG. 16, the semiconductor device according to the present embodiment is characterized in that a capacitor of the cylindrical structure includes the storage electrode having the rugged surface.

That is, the semiconductor device according to the present embodiment is characterized in that a storage electrode 28 includes a contact part 40 electrically connected to a source/drain diffused layer 20, and a cylindrical projection part 44 connected to the contact part 40 and projected on an inter-layer insulation film 22, and the surfaces of the contact part 40 and the projection part 44 have ruggedness. The semiconductor device according to the present embodiment is also characterized in that the contact part 40 has larger surface concavities than the projection part 44.

The semiconductor device having such structure can have much increased capacitance than the semiconductor device according to the first to the third embodiments.

Next, the method for fabricating the semiconductor device according to the present embodiment will be explained with reference to FIGS. 17A–17C, 18A–18B, 19A–19B, and 20A–20B.

Figure 17A:
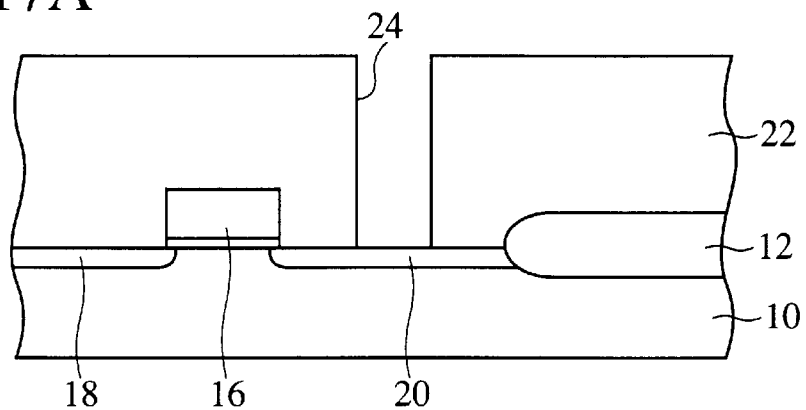
FIGS. 17A–17C, 18A–18B, 19A–19B, 20A–20B are sectional views of the semiconductor device according to the fourth embodiment in the steps of the method for fabricating the same, which explain the method.

In the same way as the method for fabricating the semiconductor device according to the first embodiment shown in FIGS. 6A to 6C, a transfer transistor, and an inter-layer insulation film 22 with a contact hole 24 formed in, which arrives at a source/drain diffused layer 20 are formed on a silicon substrate 10 (FIG. 17A).

Next, a 100 nm-thick doped amorphous silicon film 36 is deposited on the entire surface by, e.g., CVD method.

Figure 17B:
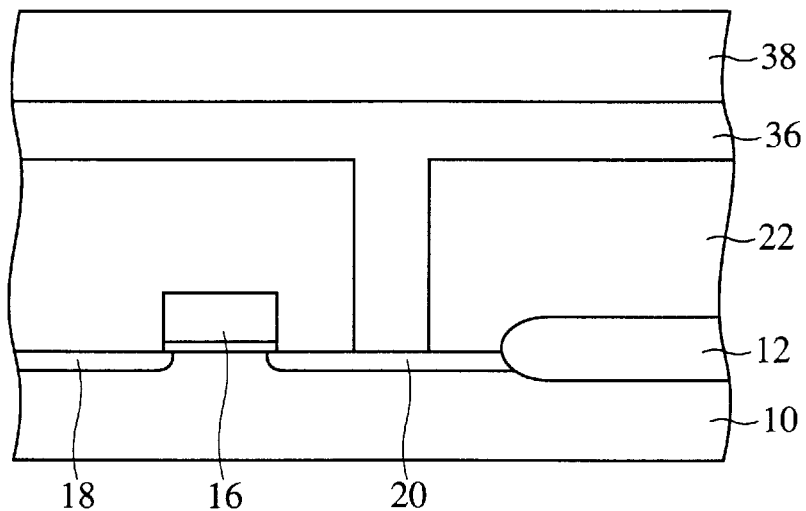
Figure 17C:
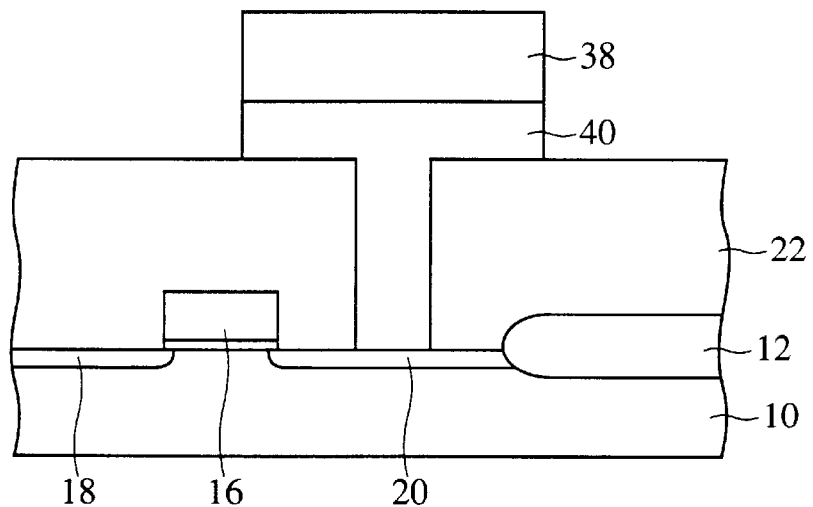

Next, a 500 nm-thick PSG (Phospho-Silicate Glass) film 38 is deposited on the entire surface by, e.g., CVD method (FIG. 17B).

Then, the PSG film 38 and the doped amorphous silicon film 36 are patterned by the usual lithography and etching to form the contact part 40 of the storage electrode, which is formed of the doped amorphous silicon film 36 and has the top surface covered with the PSG film 38.

Figure 18A:
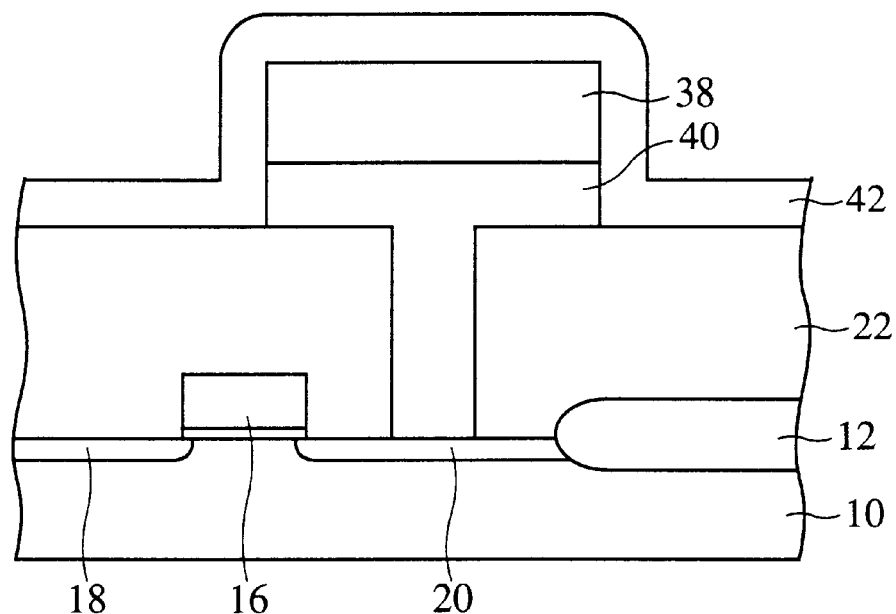

Next, a 50 nm-thick doped amorphous silicon film 42 is deposited on the entire surface by, e.g., CVD method (FIG. 18A).

Figure 18B:
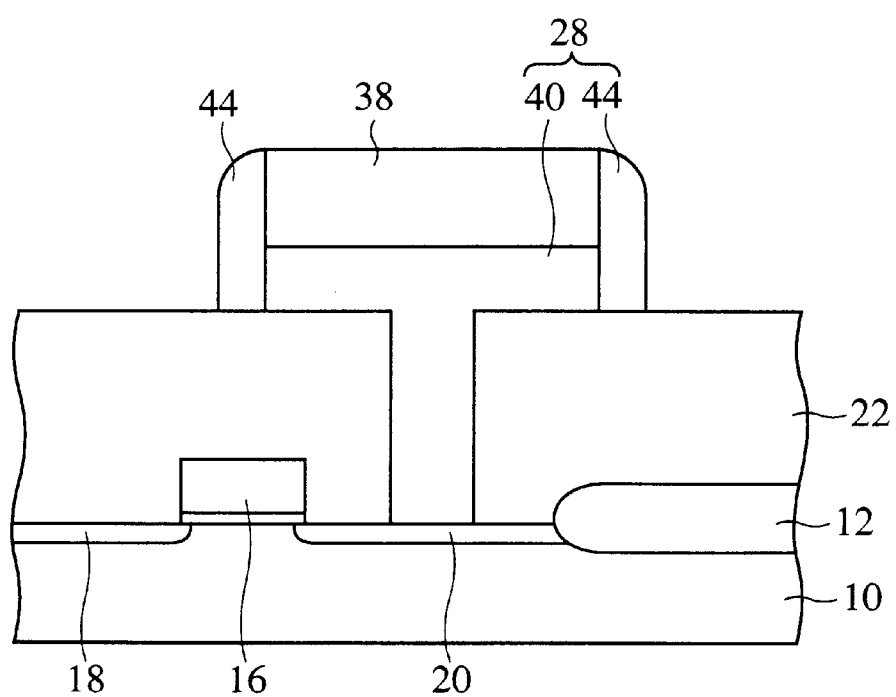

Then, the doped amorphous silicon film 42 is anisotropically etched back to form on the side walls of the contact part 40 and the PSG film 38 the projection part 44 of the storage electrode, which is formed of the amorphous silicon film 42. Thus, the storage electrode 28 having the contact part 40 and the projection part 44 is formed (FIG. 18B).

Figure 19A:
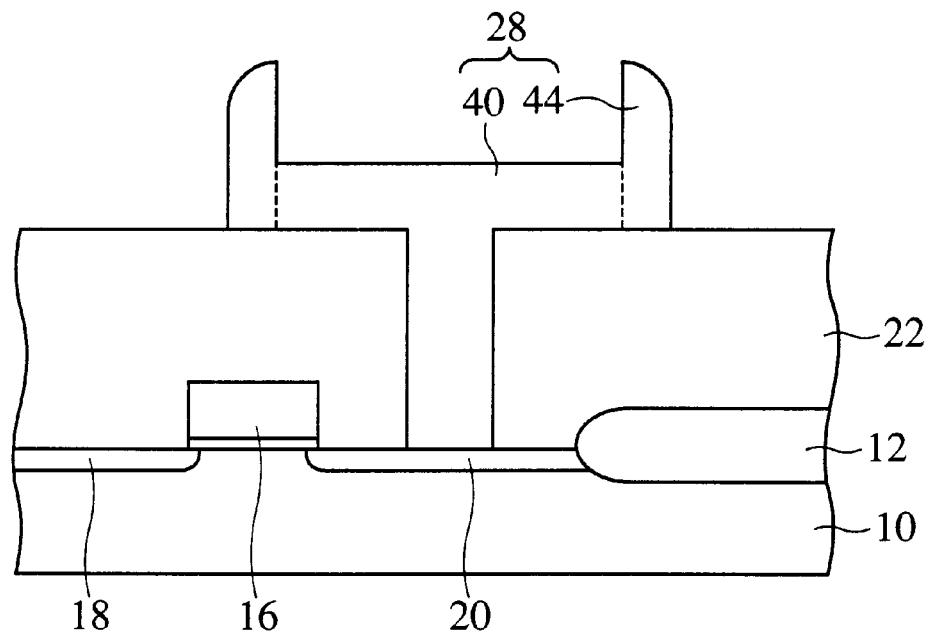

Then, the PSG film 38 is etched off by wet etching using an aqueous solution of hydrofluoric acid selectively with respect to the storage electrode 28 of the doped amorphous silicon and the inter-layer insulation film 22 of the BPSG (FIG. 19A). The selective etching of the PSG film with respect to the BPSG film can be performed by adjusting a concentration of the hydrofluoric acid in the aqueous solution and a phosphorus concentration in the PSG film.

Figure 19B:
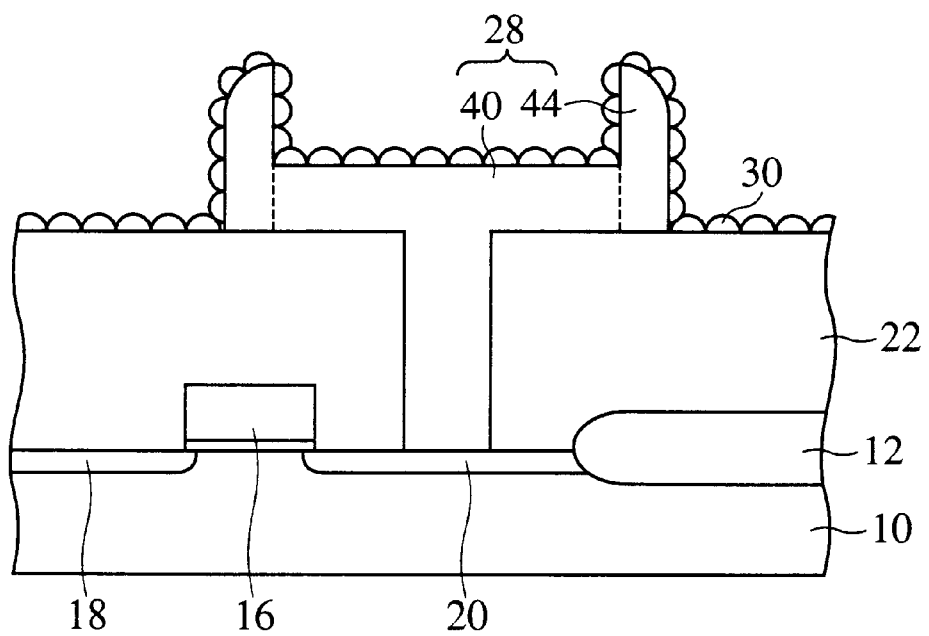

Next, a rugged polycrystalline silicon film 30 is deposited on the entire surface by, e.g., CVD method. The rugged polycrystalline silicon film 30 is deposited, for example, at a 140 scam SiH$_4$ flow rate, at a 0.175 Torr chamber pressure, at a 575° C. film forming temperature and for a 530 second film forming time. Thus, the rugged polycrystalline silicon film 30 having about 50 nm-depth concavities is formed on the inter-layer insulation film 22, covering the storage electrode 28 of the cylindrical structure (FIG. 19B).

Figure 20A:
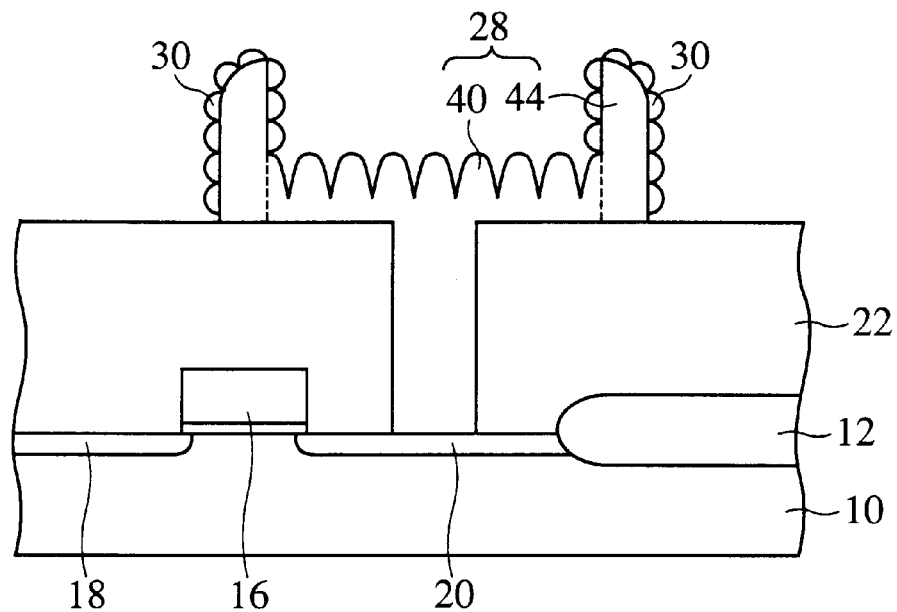

Then, the rugged polycrystalline silicon film 30 is anisotropically etched (etched back) under conditions for etching the silicon selectively with respect to the BPSG of the inter-layer insulation film 22. The rugged polycrystalline silicon film 30 is etched back, for example, at a 100 sccm chlorine gas flow rate and a 25 sccm oxygen gas flow rate, under a 1.5 mTorr reaction chamber pressure, and at a 1200 W ECR power and a 100 W RF power, whereby the rugged polycrystalline silicon film 30 on the inter-layer insulation film 22 is removed while concavities on the top surface of the contact part 40 of the storage electrode 18 can be deepened (FIG. 20A).

The concavities on the top surface of the contact part 40 of the storage electrode 28 can be selectively deepened by making the etching time longer without decreasing a height of the convexities. Accordingly, above 100 nm-depth surface concavities, which are sufficiently deeper than the surface concavities of the as-deposited rugged polycrystalline silicon film 30 of about 50 nm-depth, can be easily formed.

Figure 20B:
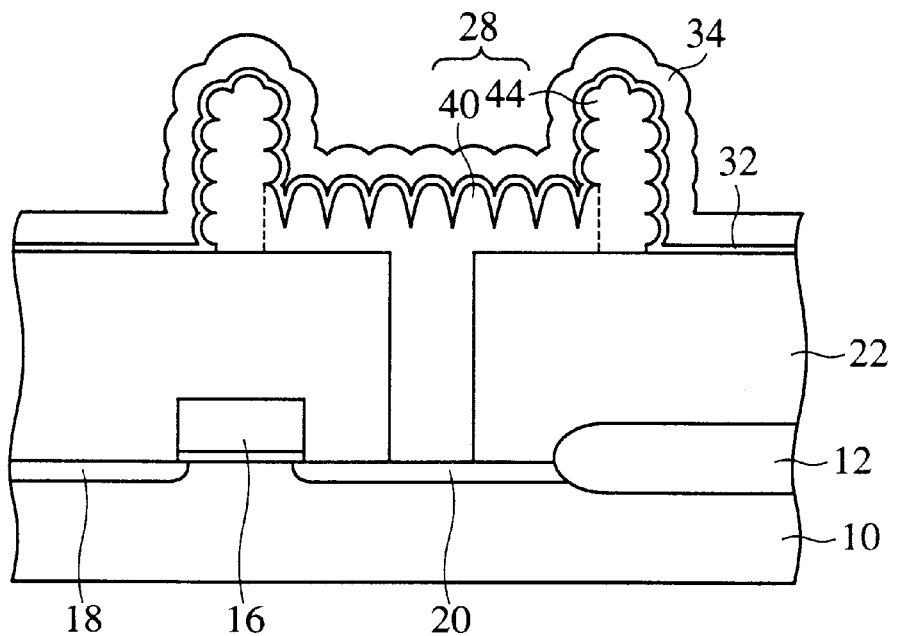
Figure 21A:
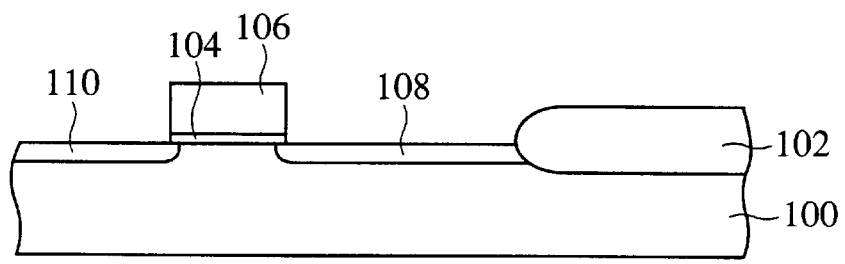
FIGS. 21A–21C, 22A–22B, and 23A–23B are sectional views of the conventional semiconductor device in the steps of the method for fabricating the same, which explain the method.
Figure 21B:
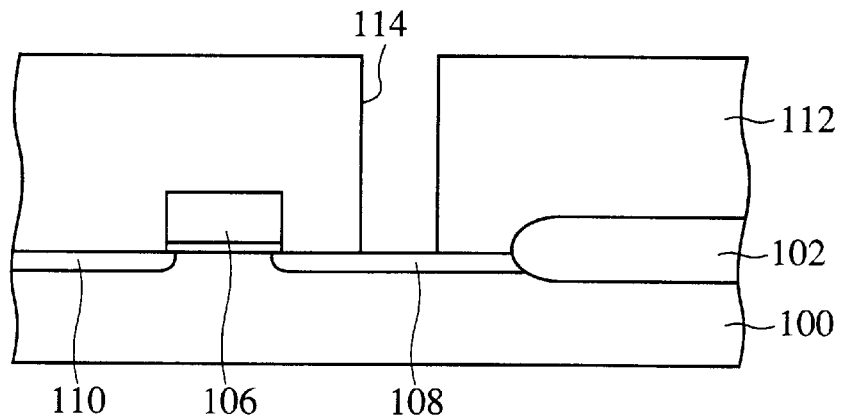
Figure 21C:
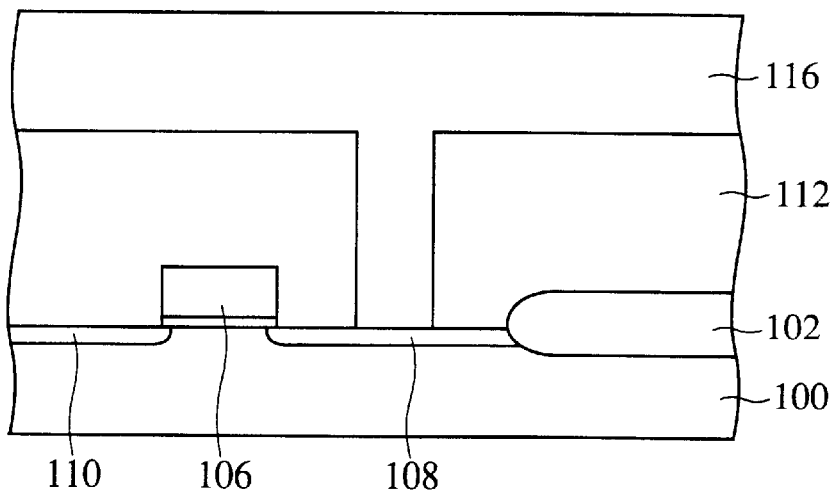
Figure 22A:
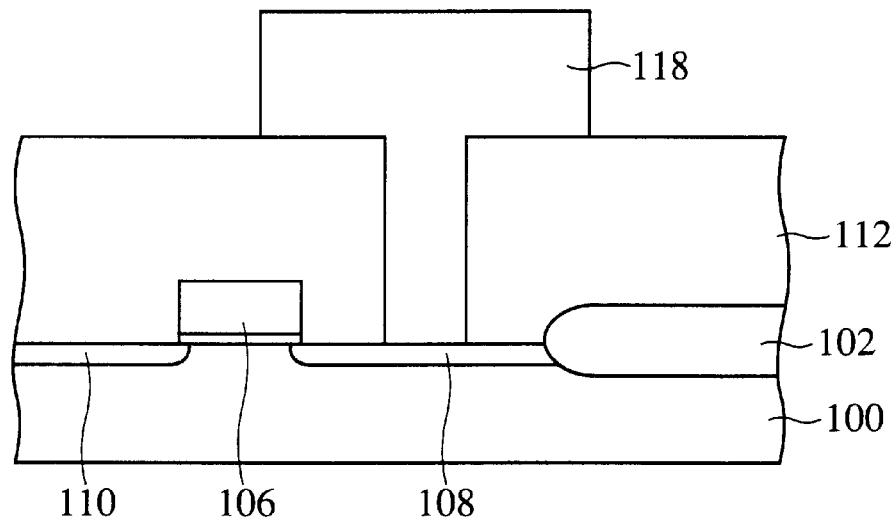
Figure 22B:
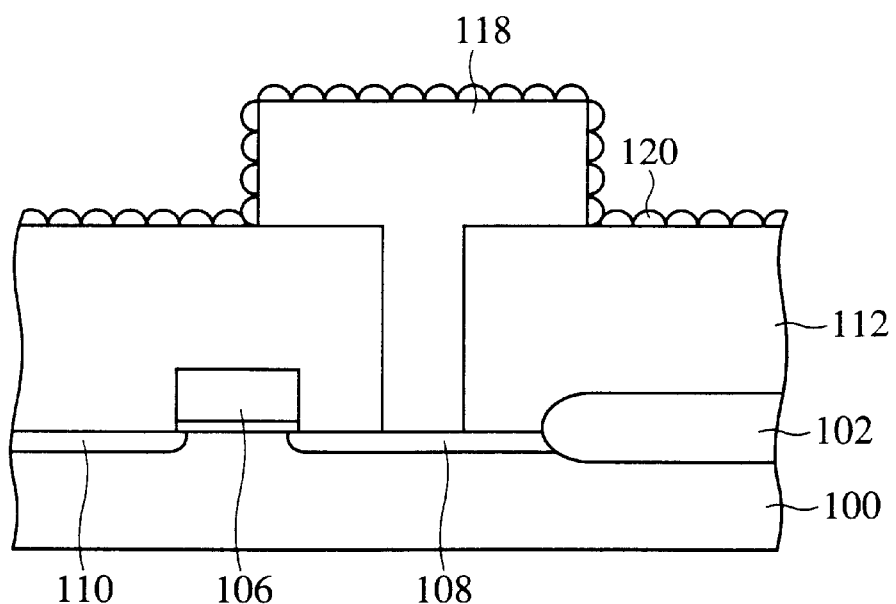
Figure 23A:
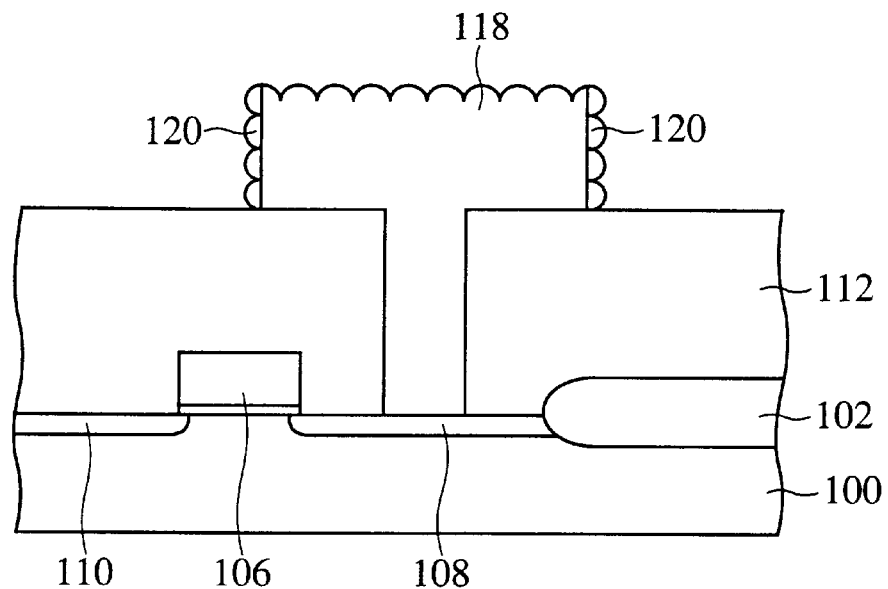
Figure 23B:
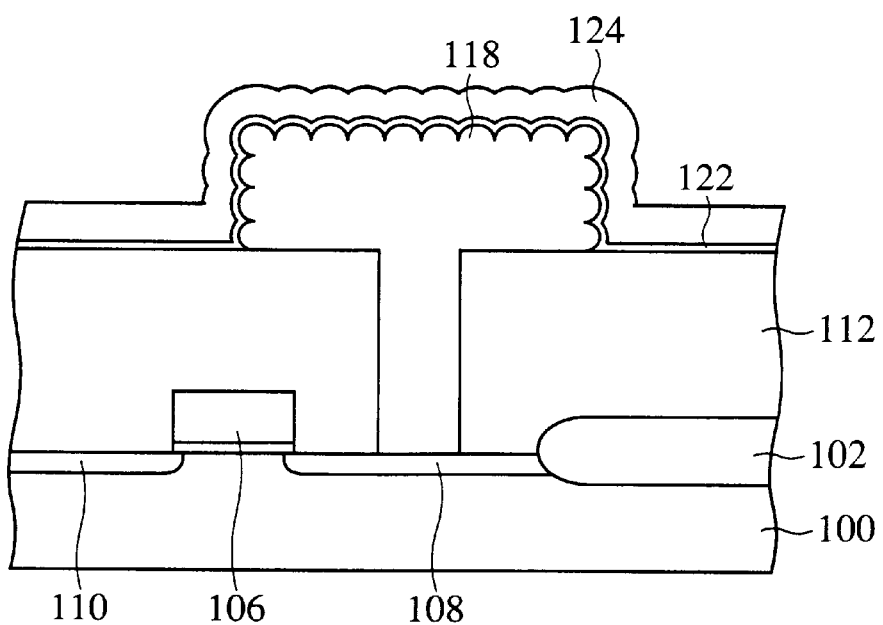

Next, in the same way as the method for fabricating the semiconductor device according to the first embodiment, a capacitor is formed, and a DRAM including one transistor and one capacitor is fabricated (FIG. 20B).

As described above, according to the present embodiment, even in using the capacitor of the cylindrical structure, the surface concavities on the top surface of the storage electrode can be deepened without decreasing a height of the storage electrode.

In the present embodiment, the rugged polycrystalline silicon film is formed on the entire surface, but may be selectively formed as in the second embodiment.

In the first to the fourth embodiments, the present invention is explained by applications to forming capacitor storage electrodes of DRAMs. However, the present invention is applicable to various device structures which require a surface rugged polycrystalline silicon film.

In the first to the fourth embodiment, ECR plasma etching is used in etching back the rugged polycrystalline silicon film. However, other anisotropic dry etchers, such as RIE, M-RIE, ICP, etc. may be used as the etcher.

As described above, according to the present invention, the rugged polycrystalline silicon film is etched back with an etching gas including a halogen based gas and O$_2$ gas under conditions which make the deposition stronger, whereby surface concavities on the top surface of the storage electrode can be deepened without decreasing a height of the storage electrode. Accordingly, the etching back of the rugged polycrystalline silicon film does not decrease a capacitance and, to the contrary, can increase the capacitance. Furthermore, it is not necessary to secure a capacitance that the doped amorphous silicon film is thicker in advance, which makes the fabrication process simple.

What is claimed is:

1. A method for fabricating a semiconductor device comprising the steps of:

forming a silicon film on an insulation film;

forming on the silicon film a rugged polycrystalline silicon film having concavities on a surface; and etching the rugged polycrystalline silicon film under an etching condition having a relatively high etching selectivity between a material forming the insulation film and silicon which make a deposition of an etching gas including a mixed gas consisting of oxygen and a halogen-based gas relatively strong with respect to an etching of silicon, so that the rugged polycrystalline silicon film and the silicon film in a region where the concavities are formed are etched to thereby form a more rugged surface than before etching.

2. A method for fabricating a semiconductor device according to claim 1, wherein in the step of forming the silicon film, the silicon film is formed, patterned in a prescribed pattern; and in the step of forming the rugged polycrystalline silicon film, the rugged polycrystalline silicon film is formed on the insulation film and on a top surface and a side wall of the patterned silicon film.

3. A method for fabricating a semiconductor device according to claim 2, wherein the step of etching the rugged polycrystalline silicon film and the silicon film includes the steps of:

etching to remove the rugged polycrystalline silicon film formed at least on the insulation film under an etching condition having a relatively low etching selectivity between the material forming the insulation film and silicon which makes a deposition of the etching gas relatively weak with respect to an etching of silicon; and etching to deepen the concavities on the top surface of the silicon film to a required depth under an etching condition having a relatively high etching selectivity between the material forming the insulation film and silicon which makes a deposition of the etching gas relatively strong with respect to an etching of silicon.

4. A method for fabricating a semiconductor device according to claim 1, wherein in the step of forming the silicon film, the silicon film is formed, patterned in a prescribed shape; and in the step of forming the rugged polycrystalline silicon film, the rugged polycrystalline silicon film is selectively formed on the top surface and the side wall of the patterned silicon film.

5. A method for fabricating a semiconductor device according to claim 1, wherein the step of forming the rugged polycrystalline silicon film is followed by the step of patterning the rugged polycrystalline silicon film and the silicon film in a prescribed pattern.

6. A method for fabricating a semiconductor device according to claim 3, wherein, in the step of etching the rugged polycrystalline silicon film and the silicon film, the rugged polycrystalline silicon film and the silicon film are etched under the same etching condition of an etching apparatus.

7. A method for fabricating a semiconductor device comprising the steps of:

forming a silicon film on an insulation film;

forming a rugged polycrystalline silicon film having concavities on a surface;

etching the rugged polycrystalline silicon film and the silicon film under an etching condition having a relatively high etching selectivity between a material forming the insulation film and silicon which make a deposition of an etching gas and/or an etching product relatively strong with respect to an etching of silicon, so that the rugged polycrystalline silicon film and the silicon film in a region where the concavities are formed are etched to thereby form a more rugged surface than before etching to form a surface rugged first electrode of the rugged polycrystalline silicon film and the silicon film;

forming a dielectric film on the first electrode; and forming a second electrode on the dielectric film.

8. A method for fabricating a semiconductor device according to claim 7, wherein in the step of forming the silicon film, the silicon film is formed, patterned in a prescribed pattern; and in the step of forming the rugged polycrystalline silicon film, the rugged polycrystalline silicon film is formed on the insulation film and on a top surface and a side wall of the patterned silicon film.

9. A method for fabricating a semiconductor device according to claim 7, wherein in the step of forming the silicon film, the silicon film is formed, patterned in a prescribed shape; and in the step of forming the rugged polycrystalline silicon film, the rugged polycrystalline silicon film is selectively formed on the top surface and the side wall of the patterned silicon film.

10. A method for fabricating a semiconductor device according to claim 7, wherein the step of forming the rugged polycrystalline silicon film is followed by the step of patterning the rugged polycrystalline silicon film and the silicon film in a prescribed pattern.

11. A method for fabricating a semiconductor device according to claim 7, wherein the step of forming the silicon film is followed by the step of forming a cylindrical structure of silicon which is connected to the silicon film and projected on the silicon film to form the first electrode of a cylindrical-shape.

12. A method for fabricating a semiconductor device comprising the steps of:

forming a silicon film on an insulation film;

forming on the silicon film a rugged polycrystalline silicon film having a convex region and a concavity region on a surface; and selectively etching the rugged polycrystalline silicon film and the silicon film in the concave region of the rugged polycrystalline silicon film with respect to the convex region of the rugged polycrystalline silicon film by a micro loading effect which makes an etching rate at the concave region higher than that at the convex region to thereby form a more rugged surface than before etching.

13. A method for fabricating a semiconductor device comprising the steps of:

forming a silicon film on an insulation film;

forming on the silicon film a rugged polycrystalline silicon film having a convex region and a concavity region on a surface; and selectively etching the rugged polycrystalline silicon film and the silicon film in the concave region of the rugged polycrystalline silicon film with respect to the convex region of the rugged polycrystalline silicon film without using an etching mask to thereby form a more rugged surface than before etching.

* * * * *